US007395168B2

(12) United States Patent
Ibe et al.

(10) Patent No.: US 7,395,168 B2
(45) Date of Patent: Jul. 1, 2008

(54) METHOD FOR EVALUATING SEMICONDUCTOR DEVICE ERROR AND SYSTEM FOR SUPPORTING THE SAME

(75) Inventors: Hidefumi Ibe, Yokohama (JP); Yasuo Yahagi, Tokyo (JP); Hideaki Kameyama, Uenohara (JP)

(73) Assignee: Renesas Technology Corp., Tokyo (JP)

( * ) Notice: Subject to any disclaimer, the term of this patent is extended or adjusted under 35 U.S.C. 154(b) by 554 days.

(21) Appl. No.: 11/037,105

(22) Filed: Jan. 19, 2005

(65) Prior Publication Data

US 2005/0211890 A1  Sep. 29, 2005

(30) Foreign Application Priority Data

Mar. 25, 2004  (JP) ............................. 2004-090352

(51) Int. Cl.
*G01V 5/10* (2006.01)
(52) U.S. Cl. ..................................... 702/115
(58) Field of Classification Search ................. 702/115
See application file for complete search history.

(56) References Cited

FOREIGN PATENT DOCUMENTS

| JP | 2001-215255 | * | 8/2001 |
| JP | 2004-125633 | | 4/2004 |
| JP | 2004-138529 | | 5/2004 |
| JP | 2004-251813 | * | 9/2004 |

OTHER PUBLICATIONS

Impact of Neutron flux on Soft Errors in MOS Memories, Akira Eto, IEEE 1998, 4 pages.*

Self-consistent Integrated System for Susceptibility to Terrestrial Neutron Induced, Soft-Error of Sub-quarter Micron Memory Devices, Yasuo Yahagi (yaha~~perl.hitachi.eo.jpE),i shi Ibe, Production Engineering Research Laboratory, Hitachi Ltd., IEEE 2002, p. 143-146.*

"Single-Event Upsets in Microelectronics: Fundamental Physics and Issues"; Henry H.K. Tang et al., MRS Bulletin; Feb. 2003; pp. 111-116.

"Self-consistent Integrated System for Susceptibility to Terrestrial Neutron Induced Soft-Error of Sub-quarter Micron Memory Devices"; Yasuo Yahagi et al.; 2002 IRW Final Report; pp. 143-146.

(Continued)

*Primary Examiner*—Tung S Lau
(74) *Attorney, Agent, or Firm*—Mattingly, Stanger, Malur & Brundidge, P.C.

(57) ABSTRACT

Spectrum data of white neutrons having different spectrum shapes, and SEE counts obtained by a white neutron method using this multiple spectrum data, are stored. A computing section reads out the spectrum data, divides the data into energy groups, and calculates and stores a total flux of each energy group. Furthermore, the computing section reads out the SEE counts with respect to each of the spectrum data and the total flux of each energy group, substitutes the SEE counts and the total flux into a simultaneous equation, and calculates the SEE cross section for each of the energy groups. Subsequently, the computing section calculates parameters which determine a formula of the approximate function of the SEE cross section as a function of energy, so that computed values of error counts obtained by integration of multiple spectra and the approximate function sufficiently match the actual measured values thereof.

2 Claims, 13 Drawing Sheets

OTHER PUBLICATIONS

"A Comparative Study Between Two Neutron Facilities Regarding SEU"; Thomas Granlund et al., Proceedings of RADECS 2003: Radiation and its Effects on Components and Systems, Noordwijk, The Netherlands, Sep. 15-19, 2003; pp. 493-497.

IBM J.Res.Devel., vol. 40, No. 1, "Terrestrial cosmic rays", Zeigler et al, pp. 19-39, 1996.

IEEE Transactions on Nuclear Science, vol. 45, No. 6, Effect of Ion Energy Uon Dielectric Breakdown of Capacitor Response in Vertical Power MOSFETs, pp. 2492-2499, 1998.

IEEE Transactions on Nuclear Science, vol. 47, No. 6, "The impact of single event gate rupture in linear devices", pp. 2373-2379, 2000.

IEEE Transactions on Nuclear Science, vol. 47, No. 6, "Analysis of SEB and SEGR in super-junction MOSFETs", pp. 2640-2647, 2000.

"Impact of Neutron flux on soft errors in MOS memories", 1998.

Nuclear Science and Engineering, vol. 106, "The Los Alamos National Library Spallation Neutron Sources", pp. 208-218, 1990.

ICITA 2002.

* cited by examiner

FIG. 4

TOTAL FLUX MANAGEMENT DB 122

| 1222 | RUN NUMBER | 1 | 2 | 3 | ⋮ |
|---|---|---|---|---|---|
| 1223 | SPECTRUM NUMBER | 1 | 3 | 4 | ⋮ |
| 1224 | FLUX NEUTRON ENERGY = 1 | $1.5 \times 10^8$ | $2.1 \times 10^8$ | $3.0 \times 10^8$ | ⋮ |
| | FLUX NEUTRON ENERGY = 2 | $2.4 \times 10^8$ | $4.5 \times 10^8$ | $4.8 \times 10^8$ | ⋮ |
| | ⋮ | ⋮ | ⋮ | ⋮ | ⋮ |

TESTING RESULT MANAGEMENT DB

| 1232 | DEVICE NAME | SRAM-A | SRAM-A | ⋮ |
|---|---|---|---|---|
| 1233 | OPERATIONAL CONDITION | FREQUENCY :10MHz Vdd:1.5V | FREQUENCY :10MHz Vdd:1.5V | ⋮ |
| 1234 | RUN NUMBER | 2 | 5 | ⋮ |
| 1235 | SEE COUNT | 121 | 13 | ⋮ |
| | ⋮ | ⋮ | ⋮ | ⋮ |

(1231)

METHOD FOR EVALUATING
SEMICONDUCTOR DEVICE ERROR AND
SYSTEM FOR SUPPORTING THE SAME

BACKGROUND OF THE INVENTION

The present invention relates to a semiconductor device error evaluation support technique, and more particularly, it relates to a technique to calculate, as a function of neutron energy, a rate of error occurrence in the semiconductor device, the error being caused by neutrons.

In recent years, remarkable progress is made on high integration of semiconductor device such as DRAM (Dynamic Random Access Memory) and SRAM (Static Random Access Memory). Concurrent with the high integration of semiconductor device in these years, a trend for reduction in size of a memory cell is in progress. Accordingly, electrostatic capacitance becomes smaller, and it is increasingly difficult to keep high reliability against soft errors, which are generally caused by alpha rays, neutron beams or the like (for example, see F. J. Ziegler, IBM J. Res. Develop., Vol. 40, No. 1, 1996, pp. 19-29, hereinafter referred to as "Non-patent Document 1"). Here, the term "soft error" means a phenomenon that information stored in a memory cell is inverted. For example, it indicates a phenomenon that electric charge generated in a semiconductor memory device due to alpha rays, neutron beams or the like is collected in a storage node (a diffusion layer part to hold data), under the influence of an electric field substantially associated with PN junction, and information "1" written in the memory cell is rewritten by information "zero".

Soft errors are temporal non-destructive events, but there is also a concern for hard errors (destructive events) to increase concurrent with a finer structure and higher integration of the semiconductor device (for example, see IEEE Transactions on Nuclear Science, Vol. 45, No. 6, pp. 2492-2499 (1998), IEEE Transactions on Nuclear Science, Vol. 47, No. 6, pp. 2373-2379 (2000), and IEEE Transactions on Nuclear Science, Vol. 47, No. 6, pp. 2640-2647 (2000), which will be referred to as "Non-patent Documents 2, 3 and 4", respectively). It is to be noted that an error (event) caused by the incidence of one particle, such as an ion and neutron, into the semiconductor device, is referred to as "SEE (Single Event Effect)".

By the way, soft errors caused by alpha rays were recognized at the end 1970's. The alpha rays are emitted from radioactive isotopes such as uranium (U) and thorium (Th), which are contained in minute quantities in a wiring material or in a packaging material constituting the semiconductor device. In 1980's, following solutions were suggested in order to enhance resistivity against the soft errors caused by the alpha rays. With the following solutions, it is thought that almost all the soft error problems caused by the alpha rays have been solved.

Solution 1:

Highly purified Materials used for the semiconductor device.

Solution 2:

Shielding alpha rays from the packaging material such as a polyimide layer or the like.

Solution 3:

Increasing or keeping electrostatic capacitance of memory devices high enough.

Solution 4:

Contrive a well structure of the semiconductor device by installing a barrier layer or the like against generated carrier.

In the meantime, possibility of soft errors caused by cosmic ray neutrons was pointed out at the end 1970's around the same time when the soft errors caused by the alpha rays were found. A principle of the soft errors caused by cosmic ray neutrons will be explained in the following.

A neutron arriving to the ground is a secondary neutron with an extremely high energy at the order of several MeV to GeV, which has been generated by a reaction between the high-energy cosmic ray and atomic nucleus such as oxygen, contained in the air. FIG. 14 is an illustration to schematically explain the principle of the soft errors caused by the cosmic ray neutrons, and it shows a cross sectional structure of a general semiconductor device (DRAM).

As illustrated, when the cosmic ray neutron 1 with high energy comes into the semiconductor device, it enters an atomic nucleus of an atom constituting the semiconductor device with a certain probability. Then, within an extremely short period of time, a cascade of elastic scattering takes place between the cosmic ray neutron and intra-nucleus nucleons (neutron and proton), and as a result, a nucleon having sufficient kinetic energy against the nucleus potential is emitted out of the nucleus. After all the releasable nucleons have been emitted, other nucleons and leptons such as deuteron and helium "evaporate" out of the nucleus, using the sum of the remaining kinetic energy as excitation energy. The above serial processing is called as nuclear spallation reaction (1$a$). For example, a proton and secondary ions 2 having all the atomic numbers from alpha particle up to $^{29}$Si (in which $^{28}$Si spins out of the lattice position, keeping the neutron absorbed therein) are generated from $^{28}$Si atomic nucleus.

Next, the secondary ion 2 generates electron hole pairs 6$a$ in the number corresponding to its energy, and simultaneously moves within the semiconductor device. When the secondary ion 2 passes through a storage node 3, which is a diffusion layer part holding data, an electric charge generated within the field outside the storage node 3 flows along the electric field. Therefore, the charge is collected into the storage node 3. An area to which the charge is collected in the storage node 3 is referred to as a charge collection area. It is to be noted here that the electric field includes a depletion layer 4 positioned outside the storage node 3, and an area 6 called funneling, positioned within the well area 5 including the storage node 3, the area 6 being generated by extension of the electric field of the depletion layer 4.

The semiconductor device as shown in FIG. 14 represents a DRAM where a capacitor 7 is added onto the storage node 3. In many cases, the DRAM has a triple well structure, in which a lower circumference of the storage node 3 (in general, it is n-type semiconductor) is covered with a well 5 being a semiconductor having opposite polarity, and the outside thereof is surrounded by a substrate 8 being a semiconductor having the same polarity as that of the storage node 3. In other words, PN junction is found on both sides, i.e., on the storage node 3 side and on the substrate 8 side, and when the secondary ion 2 penetrates into the storage node 3, the well 5 and the substrate 8, funneling extends also from the PN junction on the substrate 8 side. Therefore, almost half of the generated electric charge is collected into the storage node 3 via the depletion layer 4, and the remaining half is collected into the substrate 8 via the depletion layer 4$a$. Therefore, for example, if the secondary ion 2 penetrates into the storage node 3, the well 5 and the substrate 8, and consequently electric charge is collected into the storage node 3 where data "1" is stored, the data "1" stored in the storage node 3 is reversed to data "0"

when the collected electric charge exceeds a certain amount (referred to as "critical charge").

The principle of the soft errors caused by the cosmic ray neutrons is basically the same as the case of the alpha ray-induced soft errors. However, in the case where the soft errors are caused by a high energy neutron, it is principally different from the case of the alpha ray-induced error in the following points.

Difference 1:

Energy of generated secondary ions is high.

Difference 2:

Scattering directions of the secondary ions are isotropic.

Here, the above Difference 1 indicates that the electric charge amount generated within the semiconductor device is large, compared to the case of the alpha rays. Therefore, soft errors may easily occur in a semiconductor device in which the storage node 3 has a small critical charge. In addition, the above Difference 2 indicates a possibility that the secondary ions 2 may scatter into all the directions from the storage node 3. Therefore, a polyimide shielding (chip coating) conventionally used as a countermeasure against the alpha ray-induced soft errors is not sufficient as a countermeasure against the neutron-induced soft errors.

In the meantime, it is expected that finer structure and lower operational voltage of a semiconductor device will proceed further in the future without halt for the sake of achieving considerable increase in capacity and lower power consumption. However, as an obstacle in the move towards finer structure and lower operational voltage of the semiconductor device, an issue in terms of how to keep electrostatic capacitance held by the storage node in order to maintain the critical charge at a high level can be mentioned.

As the critical charge becomes smaller, resistivity against the soft errors caused by cosmic ray neutrons becomes lower.

In view of this situation, a primary importance has conventionally been placed on keeping a certain critical charge high by enlarging the electrostatic capacitance of the storage node, and it is considered to be one of "common practices" in structural design of semiconductor device. As is well known, in DRAM, a condenser is made within a device, so as to keep electrostatic capacitance high. However, due to a decrease in cell area concurrent with the finer structure, a high conductivity material such as $Ta_2O_5$ is employed for the condenser. Employing such an expensive material and developing an adaptation process for the material have resulted in a high cost and spending manpower. In the case of SRAM, generally, a condenser is not made within the device, unlike the case of DRAM. Concurrent with finer structure of the device, the electrostatic capacitance of the storage node is kept decreased, and this situation leaves constraint on replacing material of interlayer insulation film to be a lower dielectric constant material.

On the other hand, since spacing between parasitic transistors becomes smaller as the structure becomes finer, a parasitic thyristor is turned on, thereby causing hard errors, which are reported as a way of example, such as latch up allowing a large current to flow, and SEGR (Single Event Gate Rupture) where the secondary ions remarkably increase an electrostatic field in the proximity of a gate oxide, resulting in a destroy of the oxide film. This may place a constraint on making a gate oxide film further thinner, which is required for finer structure and lower operational voltage of the semiconductor device.

Considering the problems above, it is important to evaluate errors caused by cosmic ray neutrons in a semiconductor device, and to reflect the evaluation result on designing the semiconductor device. Table 1 shows experimental methods to evaluate error resistivity of the semiconductor device.

TABLE 1

| CLASSIFICATION OF METHODS | | FEATURES | ADVANTAGES/ DISADVANTAGES |
| --- | --- | --- | --- |
| NEUTRON IRRADIATION METHOD | FIELD TESTING | Device resistivity can be directly evaluated. | Period for device evaluation is long. Obtaining data from a wide range and with precision is difficult. |
| | WHITE NEUTRON METHOD | Spectrum similar to that of cosmic ray neutron is used, and device resistivity can be evaluated within a short period. | Limited facility for use (e.g. LANSCE, RCNP). |
| | (QUASI-) MONO-ENERGY) NEUTRON METHOD | (Quasi-) mono-energy neutron is used. Spectrum of cosmic ray neutrons is superimposed for integration and device resistivity is evaluated. Usable as a basis for a wide range of evaluation. | Limited facility for use (e.g. TSL, Tohoku Univ. Cylic., RCNP). Low flux Tail correction is necessary. |

TABLE 1-continued

| CLASSIFICATION OF METHODS | FEATURES | ADVANTAGES/ DISADVANTAGES |
|---|---|---|
| PROTON IRRADIATION METHOD | Dosimetry is easier than neutron. | Equivalency with neutron irradiation has not been verified yet. |
| HEAVY ION IRRADIATION METHOD | Evaluate a device for earth satellite Suitable for quantification of influence by individual secondary ions | Overall evaluation of secondary ion including unstable nuclide is not possible. |

As shown in Table 1, there are experimental methods to evaluate error resistivity of semiconductor device, such as a neutron irradiation method to obtain an error rate by irradiating neutrons onto the semiconductor device, a proton irradiation method to obtain an error rate by irradiating protons instead of neutrons onto the semiconductor device, and a heavy ion irradiation method to obtain an error rate by irradiating heavy ions onto the semiconductor device, the heavy ions being generated by nuclear reaction between neutrons and atomic nuclei of the semiconductor device material.

Here, a general index to evaluate the error resistivity is called SEE (Single Event Effect) cross section (in the case of soft errors, it is called SEU (Single Event Upset) cross section). In general, it is defined by the following equation as a function of incident particle energy E.

$$\sigma(E) = \frac{N_{err}(E)}{\phi(E)T_{irr}} = \frac{N_{err}(E)}{\psi(E)} \quad \text{[EQUATION 1]}$$

Here, $\Phi(E)$ denotes the number of neutrons incident to a unit area within a unit time (Flux), $T_{irr}$ denotes an irradiating time, $\Psi(E)$ denotes total number (Fluence) of neutrons incident to the unit area within the irradiating time $T_{irr}$, $N_{err}(E)$ denotes the number of errors occurred with respect to one device. $N_{err}(E)$ may also be defined as the number of errors occurred with respect to one bit. Here, $\sigma(E)$ denotes the SEE cross section in which an error rate is expressed as an area, the error being generated by one neutron having energy E incident on the semiconductor device.

FIG. 15 shows a relationship between neutron energy (MeV) in a semiconductor device (SRAM) and SEE cross section (cm²). As understood from the graph indicated by the reference numeral 16, neutron energy E has a threshold value $E_{th}$ in association with a threshold of nuclear spallation reaction. In other words, there is no possibility that an error in the semiconductor device occurs against a neutron having energy smaller than the threshold value $E_{th}$. Typically, the SEE cross section $\sigma(E)$ is saturated with a value $\sigma\infty$, which is in the higher energy side of the neutron energy E. It is to be noted that there is another report example where the SEE cross section is not saturated in the higher energy side of the neutron energy E, but it is rather reduced. Typically, the unit of flux $\Phi(E)$ is "number of incident particles/cm²/s", and the unit of the fluence $\Psi(E)$ is "number of incident particles/cm². When the error rate SER (Single Event Error) in the environment, where the semiconductor device is actually used, is represented by a unit of FIT (Failure In Time), the SER is defined by the EQUATION 2 utilizing the SEE cross section $\sigma(E)$. Here, when one error occurs every $10^9$ hours, it is defined as "1 FIT".

$$SER(FIT) = 3.6 \times 10^{12} \int_{E_{th}}^{\infty} \sigma(E) \frac{d\phi(E)}{dE} dE \quad \text{[EQUATION 2]}$$

In the meantime, the proton irradiation method, as one of the above experimental methods to evaluate an error resistivity of the semiconductor device as shown in Table 1, is based on the premise that the proton and the neutron are a kind of twin particles being different only in isotopic spin, and the nuclear reaction for the two is physically equivalent except the Coulomb barrier. However, in practice, there is not much data showing that the proton and the neutron give the same error rate. Therefore, it is not possible to say that whether or not the error evaluation method using the proton is equivalent to the method using the neutron has already been verified. The heavy ion irradiation method is suitable for a physical mechanism study. However, when the neutrons and Si atomic nuclei, for example, are subjected to nuclear reaction, several dozen of nuclides are generated, including radioactive isotopes with a short life. Therefore, in fact, it is impossible to evaluate an actual error rate against the cosmic ray neutrons.

With the reasons as described above, it is thought that neutron irradiation method is suitable for evaluating an error rate of the semiconductor device caused by the cosmic ray neutrons. Here, as shown in Table 1, the neutron irradiation method is classified into field testing, white neutron method, (quasi-) mono-energy neutron method. The field testing is a method in which the semiconductor devices are placed on the ground to be operated thereon and errors caused by actual cosmic ray neutrons are directly measured. The white neutron method is a method which irradiates high-speed protons onto a tungsten block and the like, generates white neutrons having a spectrum with a shape analogous to a shape of cosmic ray neutron spectrum, and applies the white neutrons to the semiconductor device to measure errors (see International Electron Devices Meeting, San Francisco, Calif., Dec. 6-9, 1998, pp. 367-370 (1998), and Nuclear Science and Engineering, Vol. 106, pp. 208-218 (1990), which will be referred to as "Non-patent Documents 5 and 6", respectively). The (quasi-) mono-energy neutron method is a method which irradiates high-speed protons to an Li plate, generates (quasi-) mono-energy neutrons, and measures errors by applying thus generated neutrons to the semiconductor device (for example, see International Conference on Information Technology and Application, Bathurst, No. 273-21 (2002), which will be referred to as "Non-patent Document 7).

The field testing as one of the neutron irradiation methods requires a period from at least half a year to one year or longer in order to obtain data statistically meaningful, even if around 1,000 units of semiconductor devices are used. In addition, cost for this method is expensive. Therefore, even if the field testing is necessary for simulation or verifying accelerating test, it is not practical to carry out this method for all the semiconductor devices prior to mass production thereof.

With the reasons as described above, it is thought that the white neutron method or the (quasi-) mono-energy neutron method is suitable for evaluating the error rate in the semiconductor device caused by the cosmic ray neutrons, those methods using neutrons outputted from an accelerator.

SUMMARY OF THE INVENTION

White neutron method is based on the premise that a spectrum shape of a white neutron resembles that of a cosmic ray neutron. However, since the spectrum shape of the white neutron depends on the accelerator, quantitative evaluation cannot be performed sufficiently. Furthermore, the accelerator which is capable of generating a white neutron having a spectrum shape similar to that of the cosmic ray neutron is limitedly installed in a facility such as the WNR (Weapon Neutron Research Facility) of LANSCE, for example, which is a neutron facility in the U.S. Los Alamos National Laboratory. In another accelerator facility with low energy, the spectrum shape of generated white neutron is substantially different from that of the cosmic ray neutron.

The present invention has been made in view of the above situation and an object of the present invention is to evaluate errors in a semiconductor device by use of white neutrons independent of an accelerator. In order to solve the problem above, the present invention carries out the white neutron method using different spectrum shapes, which are varied by a target material or neutron shielding, so as to obtain a measured value as to an error in the semiconductor device, and based on thus obtained error measured value, a SEE cross section is calculated, which uses a parameter common to that of the (quasi-) mono-energy neutron method.

For example, the first aspect of the present invention is directed to a semiconductor device evaluation support method which utilizes a computer system to evaluate resistivity against an error in the semiconductor device caused by cosmic ray neutrons, wherein, a storage unit in the computer system stores multiple spectrum data of white neutrons with spectrum shapes different from one another, and multiple SEE (Single Event Effect) counts obtained by a white neutron method conducted by use of each of the multiple spectrum data, and a computing unit in the computer system carries out, a first step, in which a processing of reading out the spectrum data from the storage unit, dividing the data into multiple energy groups, calculating a total flux of each of the energy groups, and storing the total flux in the storage unit, is performed with respect to each of the multiple spectrum data, and a second step which reads out from the storage unit the SEE counts and the total flux, with respect to each of the multiple spectrum data, substitutes the SEE counts and the total flux into a simultaneous equation, where a product of matrix elements indicating the total flux of each of the energy groups as to each of the multiple spectrum data and vectors indicating SEE cross section of each of the energy groups represents the SEE count as to each of the multiple spectrum data, thereby calculating the SEE cross section as to each of the energy groups, and stores the SEE cross section in the storage unit.

The second aspect of the present invention is directed to a semiconductor device evaluation support method which utilizes a computer system to evaluate resistivity against an error in the semiconductor device caused by cosmic ray neutrons, wherein, a storage unit in the computer system stores multiple spectrum data of white neutrons with spectrum shapes different from one another, and multiple SEE (Single Event Effect) counts obtained by a white neutron method conducted by use of each of the multiple spectrum data, and a computing unit in the computer system carries out, a first step which accepts from a user via an input unit, a designation of an energy threshold value, a second step which reads out multiple spectrum data except predetermined spectrum data with a small flux contribution in a lower energy portion, calculates multiple relating values of the total flux as to each of the spectrum data according to a predetermined function and the energy threshold value thus designated, simultaneously reads out the SEE counts with respect to the multiple spectrum data from the storage unit, substitutes the relating values and the SEE counts into a simultaneous equation where a product of matrix elements indicating the multiple relating values of each of the multiple spectrum data and vectors indicating multiple coefficients represents the SEE count of each of the multiple spectrum data, thereby calculating the multiple coefficients, a third step which reads out the predetermined spectrum data from the storage unit, calculates the multiple relating values of total flux as to the spectrum data according to the predetermined function and the energy threshold thus designated, reads out the SEE counts with respect to the predetermined spectrum data from the storage unit, subtracts the SEE counts thus read out from the product of the matrix elements indicating the multiple relating values of the predetermined spectrum data and the vectors indicating the multiple coefficients calculated in the second step, and calculates a reference value, and a fourth step in which the user is presented via an output unit the reference value calculated in the third step and the processing from the first steps is executed once again when a resetting direction is accepted from the user via the input unit, and when a calculating direction is accepted, the SEE cross section represented by a predetermined function using the multiple coefficients calculated in the second step is stored in the storage unit.

The third aspect of the present invention is directed to a semiconductor device evaluation support method which utilizes a computer system to evaluate resistivity against an error in the semiconductor device caused by cosmic ray neutrons, wherein, a storage unit in the computer system stores multiple spectrum data of white neutrons with spectrum shapes different from one another, and multiple SEE (Single Event Effect) counts obtained by a white neutron method conducted by use of each of the multiple spectrum data, and a computing unit in the computer system carries out, a first step including, a step which reads from the storage unit, predetermined spectrum data having a large flux contribution in a lower energy portion, inputs the predetermined spectrum data into the Weibull Fit function representing SEE cross section, thereby calculating a first relating value of the SEE counts, and simultaneously reads out from the storage unit arbitrary spectrum data other than the predetermined spectrum data, inputs the arbitrary spectrum data into the Weibull Fit function, thereby calculating a second relating value of the SEE counts, and calculates a computed ratio as a ratio between the first and the second relating values, a step which reads out from the storage unit the SEE counts as to the predetermined spectrum data and the SEE counts as to the arbitrary spectrum data, and calculates an actually measured ratio, as a ratio therebetween, and a step which calculates a difference between the computed ratio and the actually measured ratio, and the first step then repeating the above steps multiple number of times to obtain a sum of the differences, a second step which changes a parameter value of the Weibull Fit function and executes the first step repeatedly, so as to detect a parameter value to make the sum of the differences equal to or less than a predetermined value, and a third step which stores in the storage unit, an SEE cross section represented by the Weibull Fit function, by use of the parameter value thus detected.

In the present invention, it is not a prerequisite that a shape of spectrum of white neutrons resembles to that of cosmic ray neutrons. Therefore, any white neutron accelerator facilities can be effectively utilized without any conditions. In addition, parameters commonly used in (quasi-) mono-energy neutron method are employed, and mutual evaluation is available between the white neutron method and the (quasi-) mono-energy neutron method. Accordingly, a basic and versatile data can be obtained also in the white neutron method.

BRIEF DESCRIPTION OF THE DRAWING

These and other features, objects and advantages of the present invention will become more apparent from the following description when taken in conjunction with the accompanying drawings wherein:

FIG. 4 is a diagram showing an example of registered contents in total flux management DB 122.

FIG. 5 is a diagram showing an example of registered contents in testing result management DB 123.

DETAILED DESCRIPTION OF PREFERRED EMBODIMENTS

<<Principle of the Present Invention>>

When the total number of errors against the total fluence $\Psi$ of cosmic ray neutrons within a certain energy range is $N_{err}$, an apparent SEU cross section $\sigma$ is obtained by EQUATION 3.

$$\sigma = \frac{N_{err}}{\phi T_{irr}} = \frac{N_{err}}{\psi} \quad \text{[EQUATION 3]}$$

Next, an actual error rate SER (FIT) is estimated by EQUATION 4 by use of thus obtained SEU cross section a and total flux $\Phi_{env}$ of the cosmic ray neutrons within the energy range which is the same as that of the above total fluence $\Psi$.

$$SER(FIT) = 3.6 \times 10^{12} \phi_{env} \sigma \quad \text{[EQUATION 4]}$$

Figure 1:
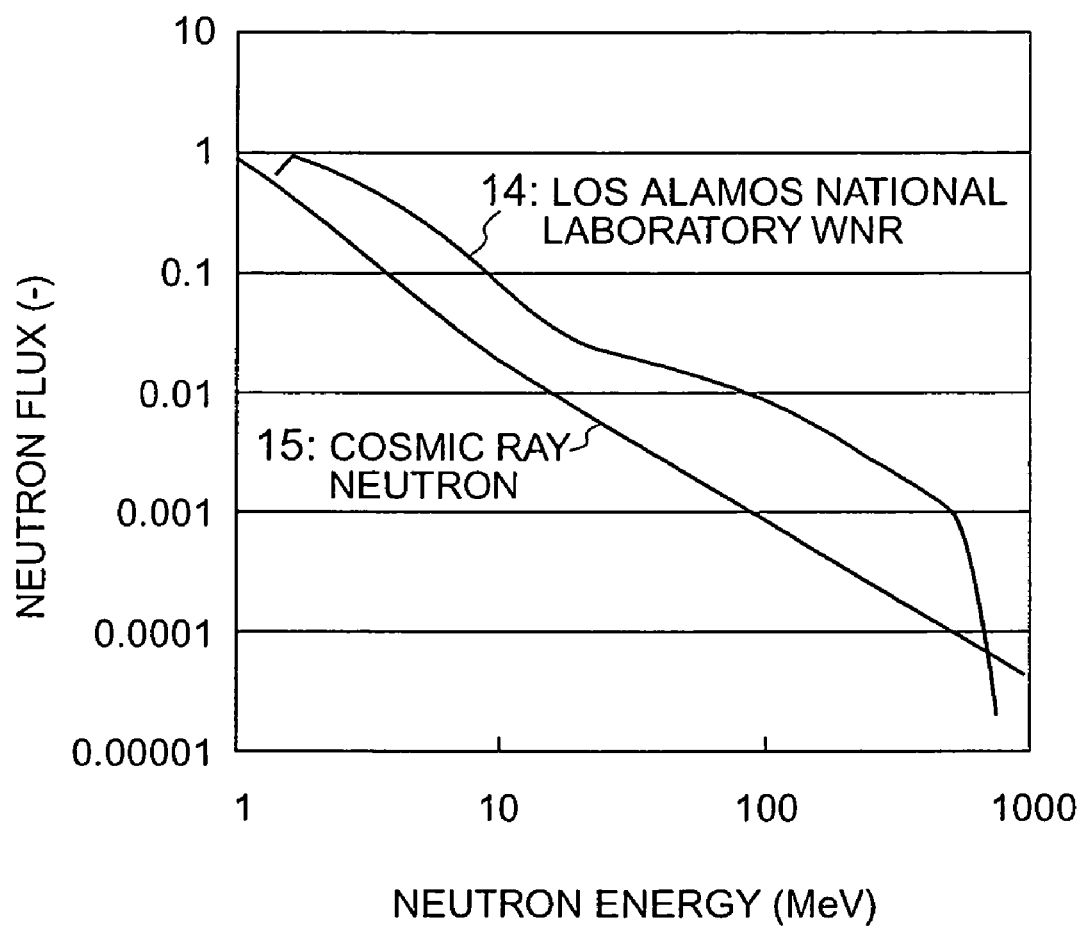
FIG. 1 is a chart which shows spectra of white neutrons of the WNR and cosmic ray neutrons, respectively.

As described above, the white neutron method is based on the premise that a spectrum shape of white neutrons is analogous to that of actual cosmic ray neutrons. FIG. 1 is a chart which shows spectra of white neutrons of the WNR and cosmic ray neutrons, respectively. As is shown, the spectrum 14 of the white neutrons of the WNR being reported and the spectrum 15 of the cosmic ray neutrons have shapes being analogous, but there are portions obviously different from each other. Therefore, it cannot be said that the equality therebetween has been verified. For example, the spectrum 14 of the white neutrons of WNR gives mean energy of 77 MeV within the range of 1-1,000 MeV. However, the mean energy of the spectrum 15 of the cosmic ray neutrons is 46 MeV, and there is a difference approximately factor of two.

Therefore, in order to evaluate the SEE cross section with high precision, the (quasi-) mono-energy neutron method is ideal. The (quasi-) mono-energy neutron method carries out an operation, in which (quasi-) mono-energy neutrons with predetermined energy are applied to the semiconductor device, for multiple number of times by varied energy. The cosmic ray spectrum is integrated based on the SEE cross sections at these multiple energy points, thereby calculating SEE occurrence count. For example, based on discrete value $\sigma(E_i)$ of the SEE cross sections obtained at multiple neutron energy $E_i$ (here, i=1, . . . , M) derived from the (quasi-) mono-energy neutron method, SEE cross section $\sigma(E)$ as an approximate function of neutron energy E is obtained, for example, by Weibull Fit function as shown in EQUATION 5.

$$\sigma(E) = \sigma_\infty \left[1 - \exp\left\{-\left(\frac{E - E_{th}}{W}\right)^S\right\}\right] \quad \text{[EQUATION 5]}$$

Here, s and W represent parameters, and $\sigma_\infty$ represents a coefficient.

Subsequently, SEE occurrence rate is calculated by EQUATION 2 as described above by use of this SEE cross section $\sigma(E)$. The approximation function may be functional formula as far as it meets the purpose. Instead of the integral equation as shown in EQUATION 2, total flux $\Phi_i$ and SEE cross section $\sigma(E_i)$ are obtained in association with the discrete energy $E_i$ (here, i=1, ..., M), for example, as defined by the JEDEC (Joint Electron DeviceEngineeringCouncil), and the SEE occurrence rate may be calculated by EQUATION 6.

$$SER(FIT) = 3.6 \times 10^{12} \sum_{i=1}^{M} \sigma(E_i)\phi_i \quad \text{[EQUATION 6]}$$

In the meantime, since in a conventional white neutron method, the SEE cross section cannot be obtained as a discrete value from a function of neutron energy, the calculation as described above cannot be applied. In addition, based on an ambiguous premise that the white neutrons are analogous to cosmic ray neutrons, the SEE occurrence rate is calculated with unclear errors, as shown in EQUATION 3 and EQUATION 4.

Encountering such a problem of the white neutron method as described above, the inventors of the present invention have found a method where SEE cross section is obtained as a function of neutron energy by use of white neutrons, focusing attention on that a shape of the white neutron spectrum can be changed by varying a target material or thickness into which a high energy proton is injected, varying a type and energy of incident particle, or as described in Non-patent Document 5 (FIG. 6), varying shielding thickness against neutron and varying exit direction thereof.

In other words, since spectra with varied shapes show different neutron energy at the peak and different mean neutron energy, many errors are generated with respect to each neutron of specific energy. Therefore, if a representative value of energy of each spectrum can be specified by any means, it is possible to quantify a neutron energy dependency as to particular SEE resistivity of a semiconductor device. Specific methods thereof will be explained in the following descriptions according to the preferred embodiments of the present invention.

First Embodiment

Figure 2:
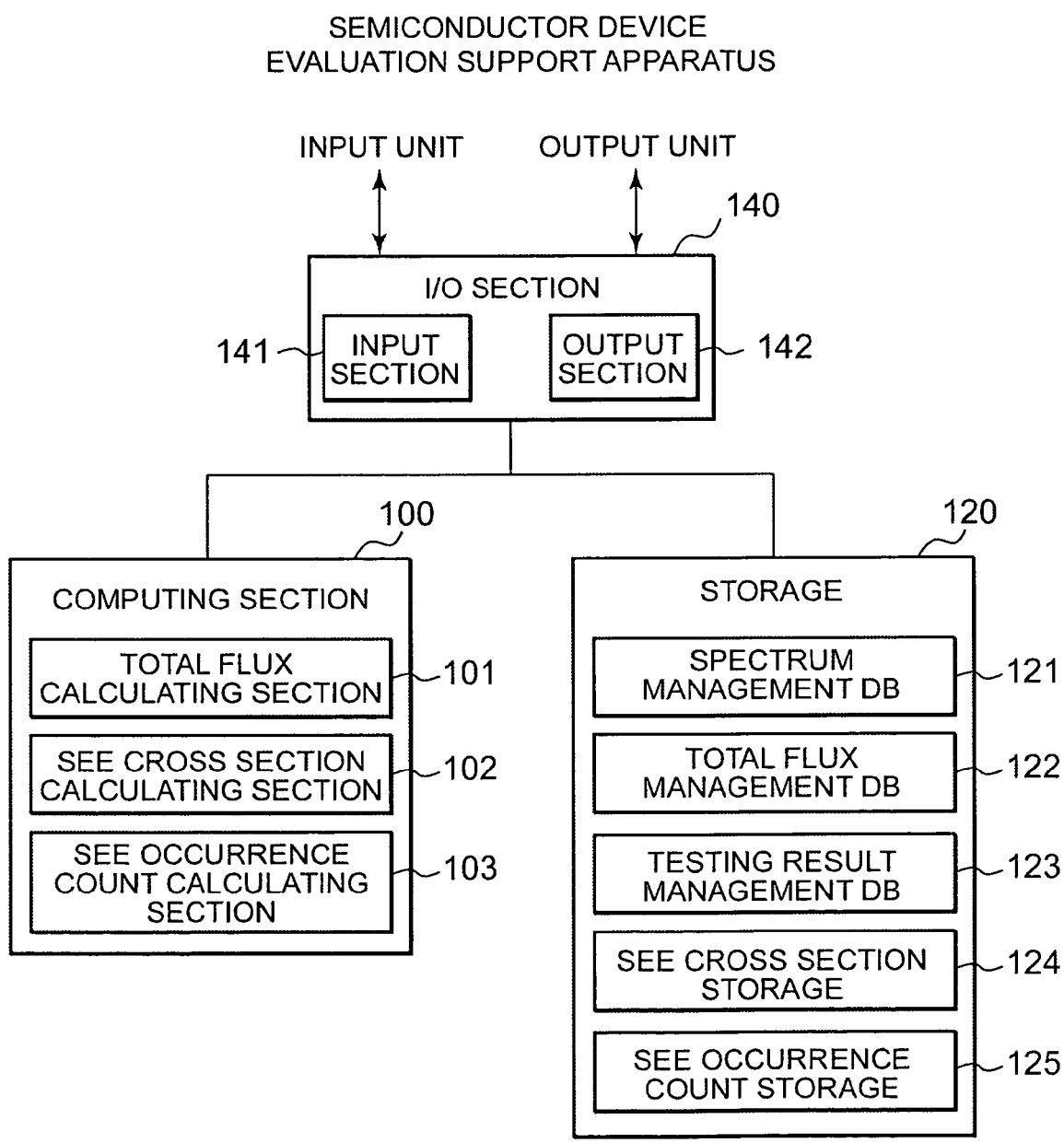
FIG. 2 is schematic diagram showing the semiconductor device evaluation support apparatus to which the first embodiment of the present invention is applied.

FIG. 2 is a schematic configuration diagram of the semiconductor device evaluation support apparatus to which the first embodiment of the present invention is applied. As is shown, the semiconductor device evaluation support apparatus of the present embodiment includes a computing section 100, storage 120 and an I/O section 140.

The I/O section 140 includes an input section 141 and an output section 142. The input section 141 accepts an input of information from an input unit such as a keyboard, mouse and the like being connected to the semiconductor device evaluation support apparatus, or from a storage medium reading apparatus which reads CD-ROM, DVD-ROM, and the like, and transmits thus accepted information to the computing section 100 and the storage 120. The output section 142 receives information from the computing section 100, and outputs thus received information to an output unit such as a monitor, a printer and the like being connected to the semiconductor device evaluation support apparatus. The storage 120 includes spectrum management DB 121, total flux management DB 122, testing result management DB 123, SEE cross section storage 124, and SEE occurrence count storage 125.

Figure 3:
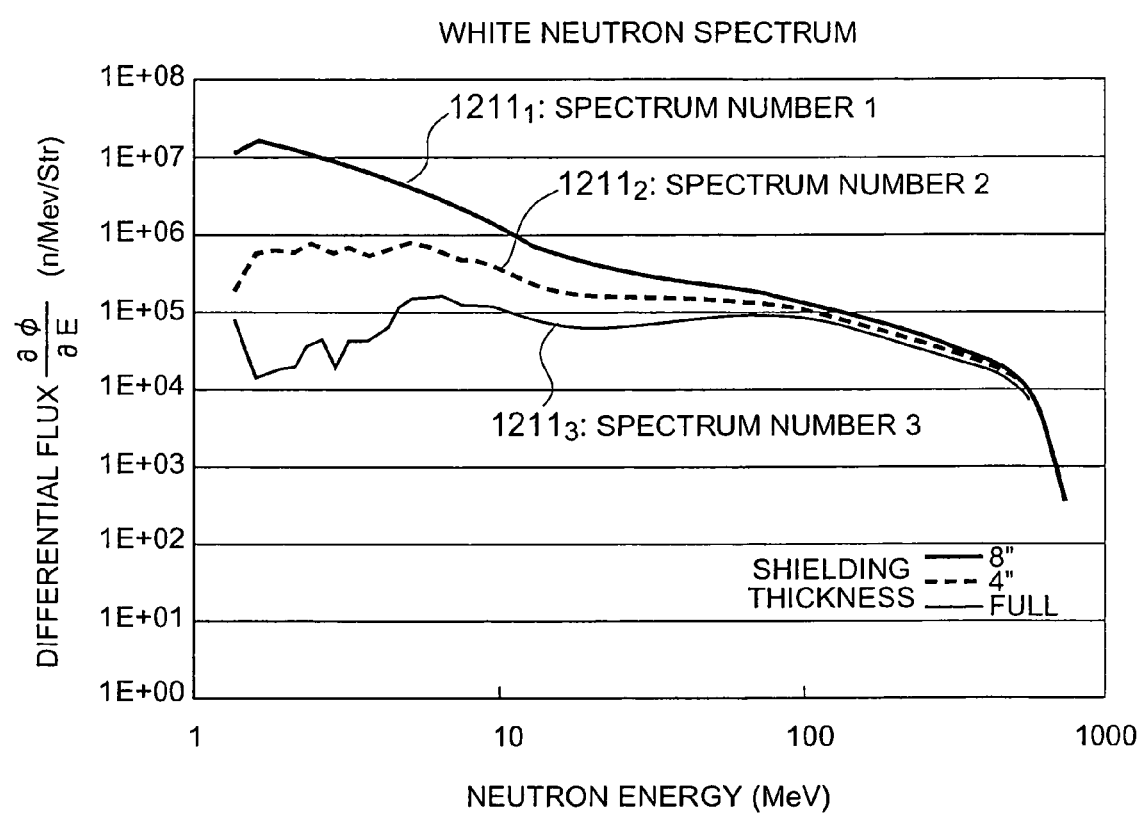
FIG. 3 is a chart to explain spectrum data which is registered in spectrum management DB 121.

In the spectrum management DB 121, spectrum data of (N) white neutrons having different spectrum shapes respectively is registered being associated with identification numbers (spectrum numbers). FIG. 3 is a chart to explain the spectrum data which is registered in the spectrum management DB 121. As is shown, the spectrum data is expressed as differential flux $\partial\phi/\partial E$ (n/Mev/Str) as a function of neutron energy E (MeV). In the example as shown in FIG. 3, three spectrum data items $1211_1$ to $1211_3$, each having a different shape, are associated with spectrum numbers 1 to 3, respectively.

The total flux management DB 122 registers a total flux (or total fluence) in each energy group (representative energy) where spectrum energy is divided into M energy groups (here, M≤N) with respect to each white neutron whose spectrum data is registered in the spectrum management DB 121, together with an identification number (RUN number) of a testing according to the white neutron method (referred to as "RUN") carried out using the pertinent white neutron. FIG. 4 is a diagram showing an example of registered contents in the total flux management DB 122. As is shown, one entry 1221 is formed including Field 1222 to register the RUN number of the RUN, Field 1223 to register the spectrum number of the white neutron used in the RUN, and (M) Fields 1224 to register the total flux of the representative energy, prepared with respect to each of the representative energy.

The testing result management DB 123 registers a result obtained in the RUN, with respect to each RUN. FIG. 5 is a diagram showing an example of registered contents in the testing result management DB 123. As is shown, one entry is formed including Field 1234 to register the RUN number, Field 1232 to register identification information (device name) of a semiconductor device as an object to-be-tested for RUN, Field 1233 to register an operational condition for the object to-be-tested, and Field 1235 to register SEE occurrence count. It is to be noted that in the present embodiment, for ease of explanation, the device name and the operational condition registered in Field 1232, 1233 are assumed to be identical in all the entries.

The SEE cross section storage 124 and the SEE occurrence count storage 125 respectively store an SEE cross section and an SEE occurrence count which are calculated in the computing section 100, which will be described below. The computing section 100 includes a total flux calculating section 101, an SEE cross section calculating section 102, and an SEE occurrence count calculating section 103.

The total flux calculating section 101 calculates a total flux at each representative energy item of the spectrum by use of spectrum data of the white neutrons registered in the spectrum management DB 121, and registers thus calculated total flux in the total flux management DB 122.

The SEE cross section calculating section 102 uses the total flux at each representative energy as to each RUN registered in the total flux management DB 122 and the SEE occurrence count in each RUN registered in the testing result management DB 123 to calculate an SEE cross section as a function of neutron energy, and stores the calculated SEE cross section in the SEE cross section storage 124.

The SEE occurrence count calculating section 103 uses the SEE cross section stored in the SEE cross section storage 124 to calculate an SEE occurrence count, and stores thus calculated SEE occurrence count in the SEE occurrence count storage 125.

Figure 6:
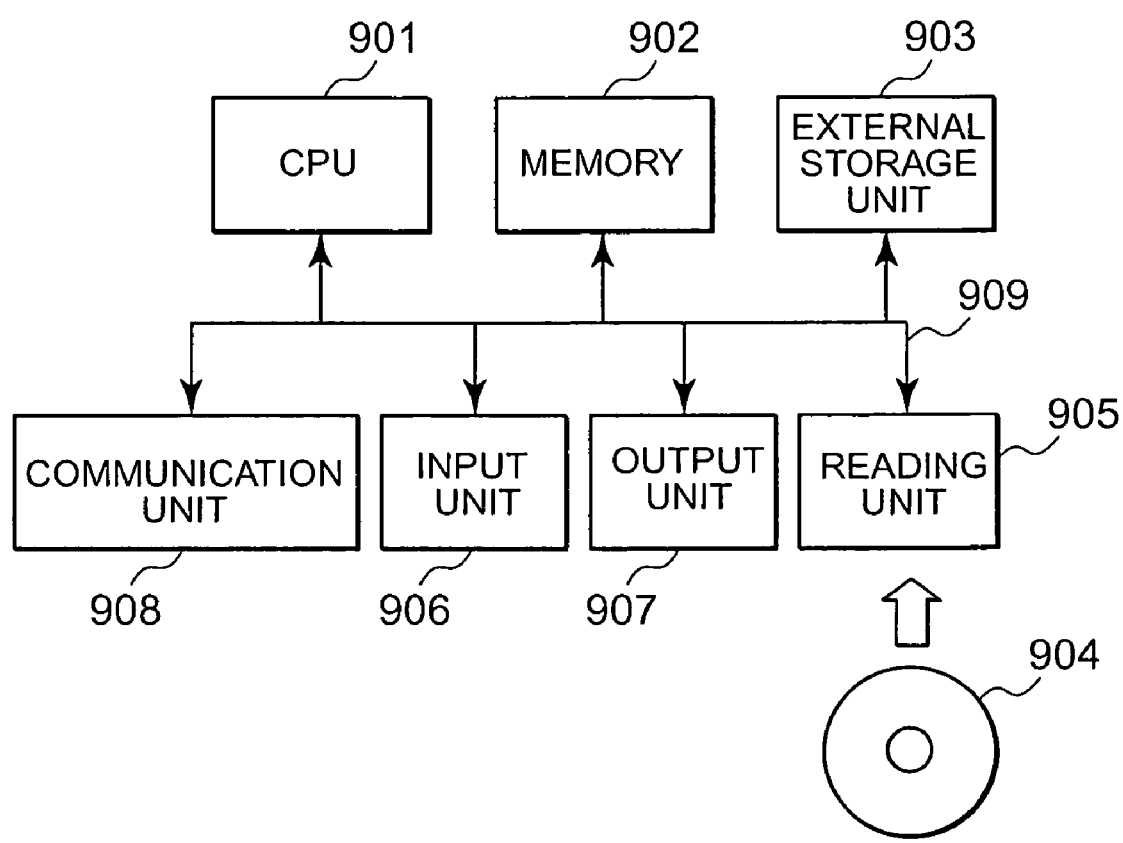
FIG. 6 is a diagram showing a hardware configuration example of the semiconductor device evaluation support apparatus.

As shown in FIG. 6, for example, the semiconductor device evaluation support apparatus with the above configuration can be implemented in a general computer system provided with a CPU 901, a memory 902, an external storage unit 903 such as HDD, a reading unit 905 to read out information from a storage medium 904 with portability such as CD-ROM, DVD-ROM and the like, an input unit 906 such as a keyboard and a mouse, an output unit 907 such as a display, a communication unit 908 to establish connection with a network, and a bus 909 to connect the above units, by allowing the CPU 901 to execute a predetermined program loaded on the memory 902.

This predetermined program may be downloaded from the storage medium 904 via the reading unit 905. Alternatively, the program may be downloaded from the network on the external storage unit 903 via the communication unit 908 and then it may be loaded onto the memory 902 and executed by the CPU 901. Alternatively, the program may be directly loaded onto the memory 902 from the storage medium 904 via the reading unit 905 or from the network via the communication unit 908, and executed by the CPU 901. In the case above, the memory 902 or external storage unit 903 serves as the storage 120. The reading unit 905, input unit 906, output unit communication unit 908 serve as the I/O section 140.

Next, operations of the semiconductor device evaluation support apparatus with the above configuration will be explained.

At first, operations of the total flux calculating section 101 will be explained.

Figure 7:
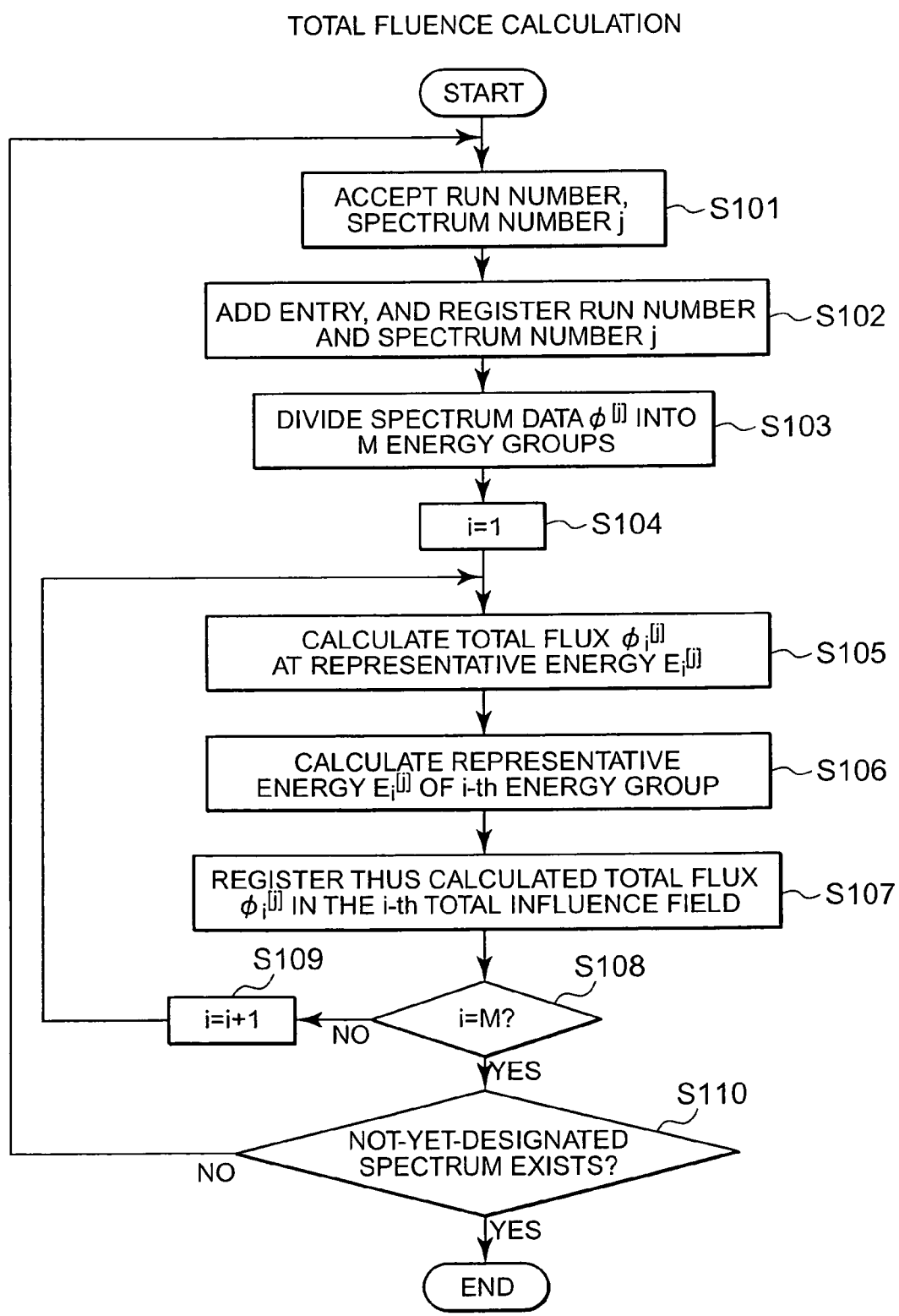
FIG. 7 is a flowchart to explain an operational flow of total flux calculating section 101 according to the first embodiment of the present invention.

FIG. 7 is a flowchart to explain an operational flow of the total flux calculating section 101. This flow is based on the premise that spectrum data of (N) white neutrons having different spectrum shapes are inputted from outside via the input section 141, and registered in the spectrum management DB 121.

At first, the total flux calculating section 101 displays or the like on the display unit via the output unit 142, a spectrum number of each spectrum data registered in the spectrum management DB 121, and accepts from a user via the input section 141 and the input unit, a designation of RUN number and the spectrum number j of the white neutron which was used in the RUN identified by the RUN number (S101).

Next, the total flux calculating section 101 adds a new entry 1221 to the total flux management DB 122. Subsequently, the total flux calculating section 101 registers the RUN number and the spectrum number j thus accepted respectively in Field 1222 and Field 1223 of the entry 1221 (S102).

Figure 8:
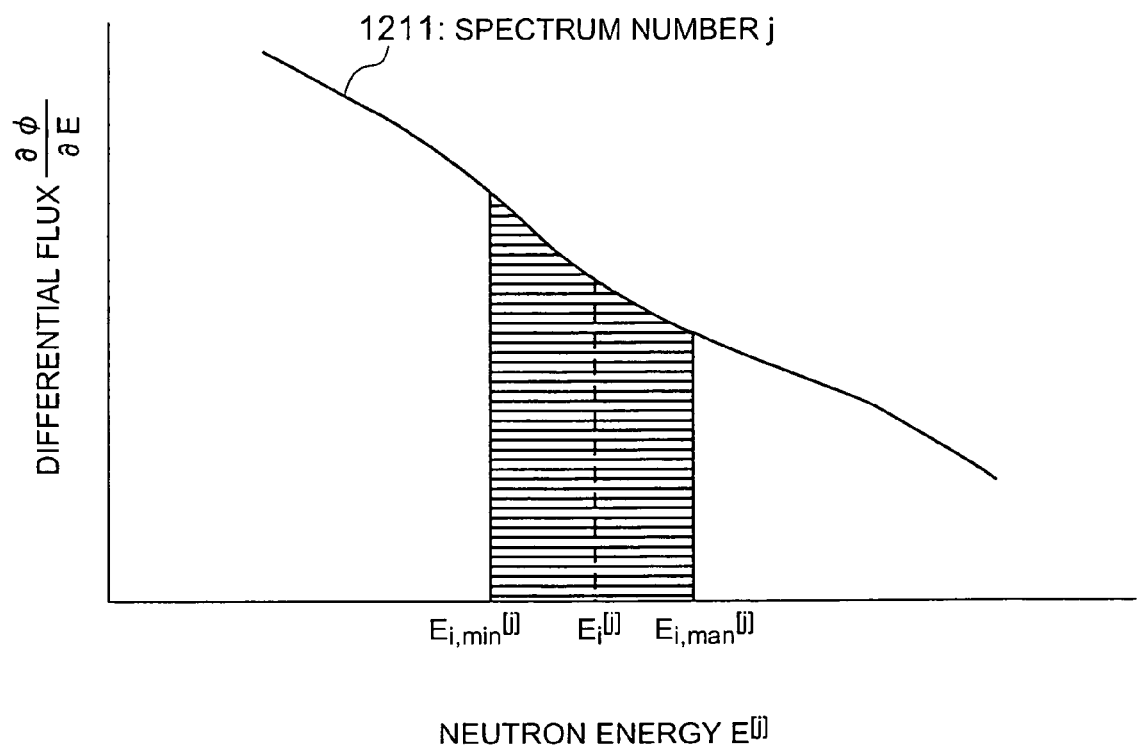
FIG. 8 is a chart to explain an energy dividing process in the total flux calculating section 101 according to the first embodiment of the present invention.

Next, the total flux calculating section 101 reads out the spectrum data having thus accepted spectrum number j from the spectrum management DB 121. Then, as shown in FIG. 8, the spectrum data 1211 thus read out is divided into M (here M≦N) neutron energy groups, and each energy group is numbered sequentially from the smallest energy (S103).

Next, the total flux calculating section 101 sets the count value i which represents the number given to the energy groups to 1 (S104). Subsequently, by use of the spectrum data of the i-th energy group, the total flux calculating section 101 calculates according to the EQUATION 7, the total flux $\Phi_i^{[j]}(E_i^{[j]})$ at a temporary representative energy $E_i^{[j]*}$ (for example, mean value) of the i-th energy group (S105).

$$\phi_i^{[j]}(E_i^{[j]*}) = \int_{E_{i,min}^{[j]}}^{E_{i,max}^{[j]}} \left( \frac{\partial \Phi^{[j]}}{\partial E} \right) dE \qquad [\text{EQUATION 7}]$$

Here, $E_{i,min}^{[j]}$ represents the minimum energy value of the i-th energy group, $E_{i,max}^{[j]}$ represents the maximum energy value of the i-th energy group, and j represents the spectrum number.

Next, the total flux calculating section 101 determines a true representative energy $E_i^{[j]}$ of the i-th energy group (S106). In the present embodiment, the calculation is performed according to EQUATION 8 assuming that the mean value of the i-th energy group as the representative energy $E_i^{[j]}$.

$$E_i^{[j]} = \int_{E_{i,min}^{[j]}}^{E_{i,max}^{[j]}} E \left( \frac{\partial \Phi^{[j]}}{\partial E} \right) dE / \phi_i^{[j]}(E_i) \qquad [\text{EQUATION 8}]$$

Then, the total flux calculating section 101 registers thus calculated total flux $\Phi_i^{[j]}$ ($E_i^{[j]}$), together with the representative energy $E_i^{[j]}$ in the i-th field 1224 of the added entry (spectrum number j) (S107).

In the meantime, the total flux calculating section 101 checks whether or not the count value i is M (S108), and if it is not M, the count value i is incremented by one (S109), and the process returns to S105. On the other hand, if the count value i is M, the total flux calculating section 101 checks whether or not there is registered in the spectrum management DB 121, spectrum data having the spectrum number not designated yet, that is, the entry thereof has not been added in the total flux management DB 122 (S110). If such spectrum data is not registered, this flow is completed. On the other hand, if it is registered, the process returns to S101, and the total flux calculating section 101 accepts from a user a designation of the spectrum number, which has not been designated yet, together with the designation of RUN number. At this stage, the total flux calculating section 101 may display not-yet-designated spectrum numbers on the display unit via the output unit 142. Furthermore, the total flux calculating section 101 may check whether or not the RUN number received with the spectrum number is already registered in the total flux management DB 122. If it is registered, the total flux calculating section may display that it is registered and prompt the user to input another RUN number, so as to accept a RUN number not yet registered in the total flux management DB 122.

With the processing as described above, the total flux management DB 122 registers a total flux at each representative energy in the case where spectrum energy is divided into M energy groups with respect to each white neutron whose spectrum data is registered in the spectrum management DB 121, together with the RUN number of the RUN carried out by use of the pertinent white neutron.

Next, operations of the SEE cross section calculating section 102 will be explained.

Figure 9:
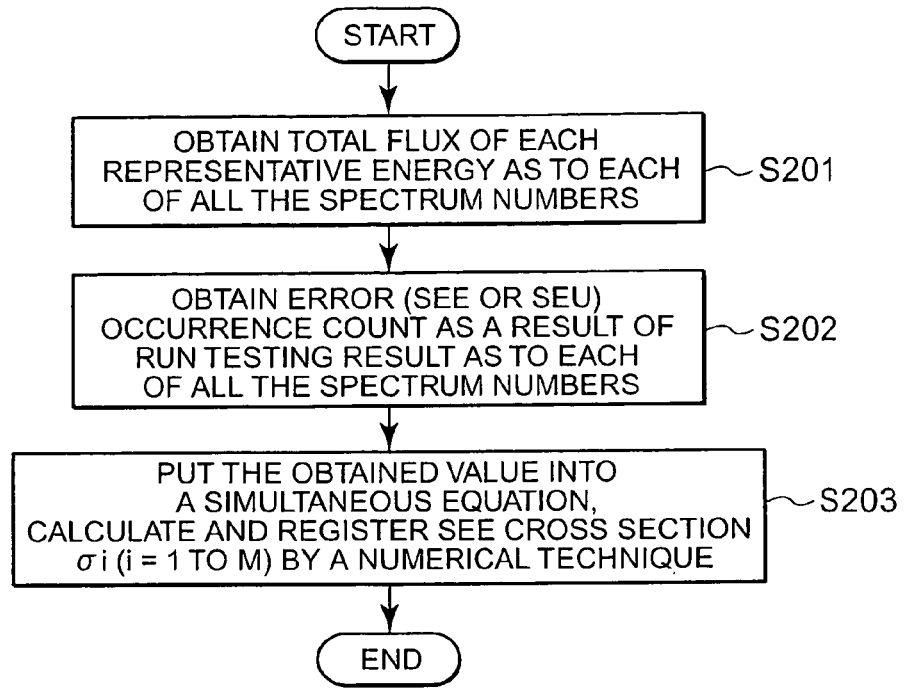
FIG. 9 is a flowchart to explain an operational flow of SEE cross section calculating section 102 according to the first embodiment of the present invention.

FIG. 9 is a flowchart to explain an operational flow of the SEE cross section calculating section 102. This flow is based on the premise that after the above processing in the total flux calculating section 101, the total flux at each representative energy is registered in the total flux management DB 122 together with the RUN number, with respect to each of (N) white neutrons, and a testing result for each RUN number registered in the total flux management DB 122 is registered in the testing result management DB 123.

At first, the SEE cross section calculating section 102 obtains a total flux $\Phi_i^{[j]}$ ($E_i^{[j]}$) at each representative energy item of each of the spectrum numbers from the total flux management DB 122. Here, j represents a spectrum number (j=1 to N), and i represents a number given to the energy groups (i=1 to M) (S201).

Next, the SEE cross section calculating section 102 specifies a RUN number registered in the total flux management DB 122 in association with the spectrum number j as to each of the spectrum numbers j, and obtains an error count $N_{err}^{[j]}$ being associated with the RUN number which is obtained from the testing result management DB 123 (S202).

When the SEE cross section at the i-th representative energy is assumed as $\sigma_i$, a relationship as shown in EQUATION 9 is established between the SEE cross section $\sigma_i$ and the error count $N_{err}^{[j]}$ which is obtained as a result of the RUN using the white neutron having the spectrum number j.

$$N_{err}^{[j]} \equiv T_{irrad}^{[j]} \int_{E_{th}}^{\infty} \left( \frac{\partial \Phi^{[j]}}{\partial E} \right) \sigma(E) \, dE \approx T_{irrad}^{[j]} \sum_{i=1}^{M} \phi_i^{[j]} \sigma_i \quad \text{[EQUATION 9]}$$

Here, $T_{irr}^{[j]}$ represents an irradiation time used in the RUN for the RUN number j, and $\sigma(E)$ represents the SEE cross section as a function of energy.

EQUATION 9 forms a simultaneous equation for the SEE cross section $\sigma_i$ which is shown in EQUATION 10. Then, the SEE cross section calculating section 102 already-existing numerical calculation technique such as Gauss method. Subsequently, the SEE cross section calculating section 102 stores thus calculated SEE cross section $\sigma_i$ in the SEE cross section storage 124 (S203).

$$\begin{pmatrix} \phi_1^{[1]} & \phi_2^{[1]} & \cdots & \phi_{M-1}^{[1]} & \phi_M^{[1]} \\ \vdots & \ddots & & & \vdots \\ \vdots & & \ddots & & \vdots \\ \vdots & & & \ddots & \vdots \\ \phi_1^{[M]} & \phi_2^{[M]} & \cdots & \phi_{M-1}^{[M]} & \phi_M^{[M]} \end{pmatrix} \begin{pmatrix} \sigma_1 \\ \sigma_2 \\ \vdots \\ \sigma_{M-1} \\ \sigma_M \end{pmatrix} T_{irr} = \begin{pmatrix} N_{err}^{[1]} \\ N_{err}^{[2]} \\ \vdots \\ N_{err}^{[M-1]} \\ N_{err}^{[M]} \end{pmatrix} \quad \text{[EQUATION 10]}$$

For ease of explanation, in EQUATION 10, the irradiation time periods $T_{irrad}^{[j]}$ for the respective RUNs are all equally assumed as $T_{irr}$. However, if they are different, it is possible to delete $T_{irr}$, and replace the matrix elements $\Phi_i^{[j]}$ on the left end with the fluence $\Phi_i^{[j]} * T_{irrad}^{[j]}$.

Next, operations of the SEE occurrence count calculating section 103 will be explained.

Figure 10:
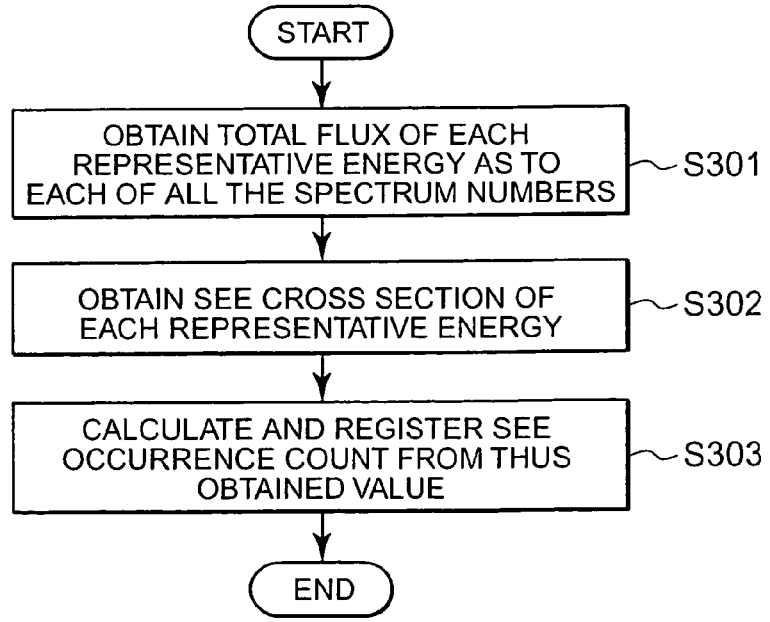
FIG. 10 is a flowchart to explain an operational flow of SEE occurrence count calculating section 103 according to the first embodiment of the present invention.

FIG. 10 is a flowchart to explain an operational flow of SEE occurrence count calculating section 103. This flow is based on the premise that a testing result of each RUN number registered in the total flux management DB 122 is registered in the testing result flow of SEE occurrence count calculating section 103. This flow is based on the premise that a testing result of each RUN number registered in the total flux management DB 122 is registered in the testing result management DB 123, in addition, after the above processing in the total flux calculating section 101, the total flux at each representative energy with respect to each of (N) white neutrons is registered in the total flux management DB 122 together with the RUN number, and after the above processing in the SEE occurrence count calculating section 103, the SEE cross section at each representative energy is registered in the SEE cross section storage 124.

At first, the SEE occurrence count calculating section 103 obtains the total flux $\Phi_i^{[j]}$ ($E_i^{[j]}$) at each representative energy item of each spectrum number from the total flux management DB 122 (S301). Next, the SEE occurrence count calculating section 103 obtains the SEE cross section $\sigma_i$ at each representative energy from the SEE cross section storage 124 (S302). Then, the SEE occurrence count calculating section 103 uses thus obtained information items to calculate an SEE occurrence count $N_{err}$ according to EQUATION 11. Subsequently, the SEE occurrence count calculating section 103 stores thus calculated SEE occurrence count in the SEE occurrence count storage 124 (S303).

$$N_{err} = T_{irr} \sum_{i=1}^{M} \sigma_i \phi_i \quad \text{[EQUATION 11]}$$

Here, $\Phi_i$ represents a mean value of the total flux $\Phi_i^{[j]}$ ($E_i^{[j]}$) at representative energy $E_i^{[j]}$ having the same number i.

With the processing as described above, the SEE cross section and the SEE occurrence count which are respectively stored in the SEE cross section storage 124 and the SEE occurrence count storage 125 are outputted from the output section 142, in accordance with instructions from a user accepted via the input section 141.

The first embodiment of the present invention has been explained in the description above. It should be noted that the present embodiment includes the following points:

(a)

It is preferable that in dividing into energy groups, the size of the flux (or fluence) of each energy group is determined to be approximately the same. If a difference in size by division becomes larger, that may increase errors.

(b)

There is a threshold value $E_{th}$ for the SEE cross section, and the flux (or fluence) equal to or less than the threshold value does not influence the SEE. Therefore, the integral range in EQUATION 8 for the lowest energy group is preferably set to be equal to or higher than the threshold value $E_{th}$. Here, the threshold value $E_{th}$ can be estimated numerically. In other words, when the integral lower limit $E_1^{[1]}$ of the lowest every group in EQUATION 8 is assumed as lower than the threshold value $E_{th}$, the flux contributing to the SEE of the energy group becomes larger than actual value, and this result is reflected to make the solution $\sigma_1$ of EQUATION 10 negative value. In view of this, firstly the integral lower limit is increased to obtain $E_1^{[1]}$ which makes the solution $\sigma_1$ zero. With respect to this integral lower limit, the flux that contributes to the SEE and the flux that does not contribute to the SEE are almost balancing. Therefore, it is possible to estimate the threshold value $E_{th}$ as a value satisfying EQUATION 12.

[EQUATIONS 12]

$$G = \int_{E_l}^{E_h} \phi(E)dE$$

$$\int_{E_l}^{E_{th}} \phi(E)dE = \frac{G}{2}$$

Here, $\Phi(E)$ represents a neutron flux as a function of energy, and it is calculated in the total flux calculating section 101 with the data extracted from the total flux management DB 123.

Second Embodiment

In the first embodiment above, there is a possibility that a value of the SEE cross section becomes negative depending on how the energy group range (division width) is set. Therefore, a difficulty is found in setting the energy group range so that all the solutions become positive. A semiconductor device evaluation support apparatus according to the present embodiment can make up for this weak point of the first embodiment. It is to be noted that in the semiconductor device evaluation support apparatus according to the present embodiment, the total flux calculating section 101 and the total flux management DB 122 are not necessary. Instead of those elements, a field for registering a spectrum number of spectrum data which is used in RUN is added to the entry of the testing result management DB 123. Furthermore, in the present embodiment, processing in the SEE cross section calculating section 102 and that of the SEE occurrence count calculating section 103 are different from those in the first embodiment. Except the above points, the present embodiment is identical to the first embodiment.

Figure 11:
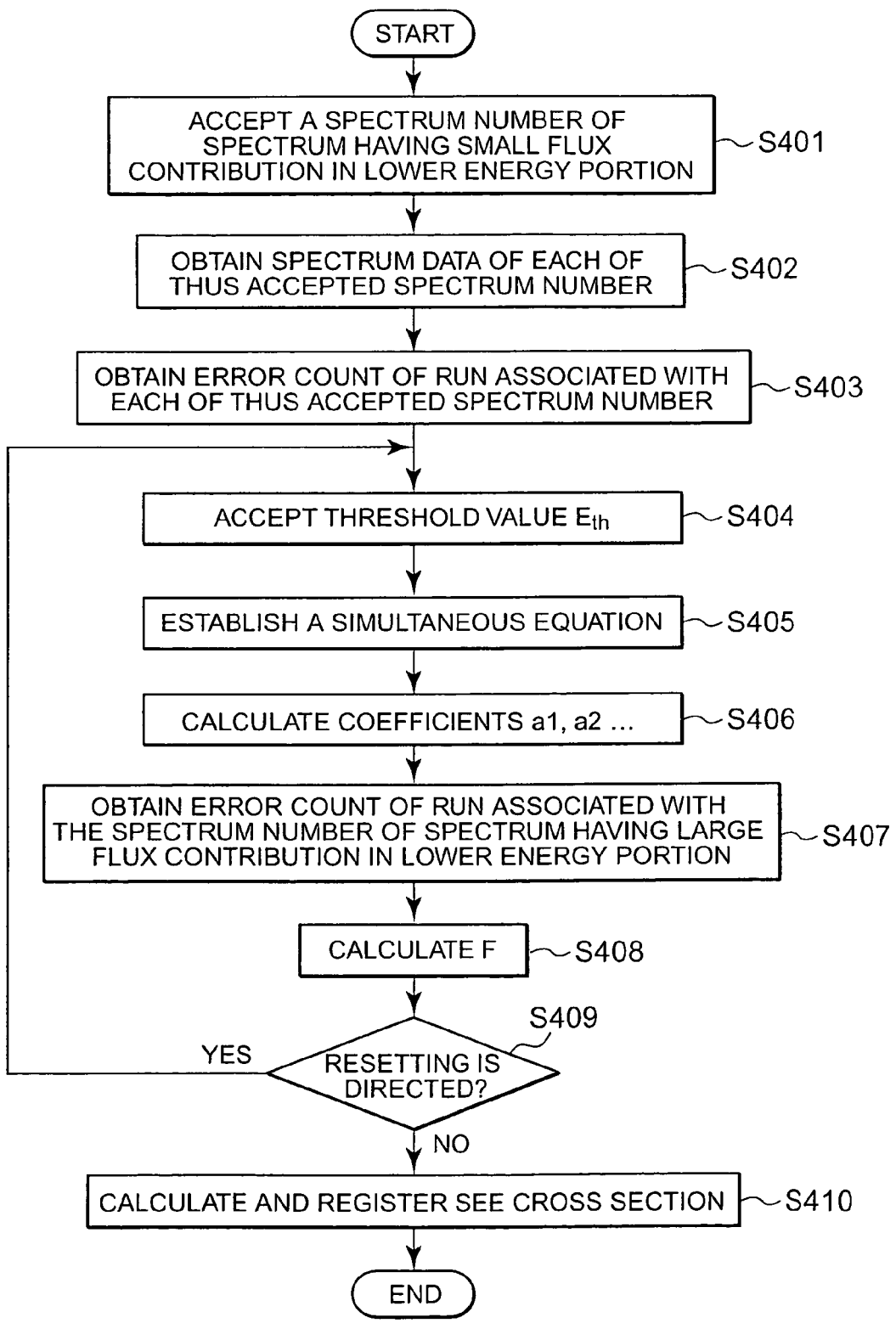
FIG. 11 is a flowchart to explain an operational flow of SEE cross section calculating section 102 according to the second embodiment of the present invention.

FIG. 11 is a flowchart to explain an operational flow of the SEE cross section calculating section 102 according to the second embodiment of the present invention.

The SEE (or SEU) cross section is approximated with the function as shown in EQUATION 13. Here, k represents the number of white neutron spectra.

$$E^* = E - E_{th}$$ [EQUATION 13]

$$\sigma(E^*) = a_1(\log E^*)^{\frac{1}{2}} + a_2(\log E^*)^{\frac{1}{3}} \ldots + a_k(\log E^*)^{\frac{1}{k+1}}$$

Here, the threshold value $E_{th}$ is generally set to around 2-10 MeV. Firstly, the threshold value $E_{th}$ is assumed to be a value $E_{low}$ (for example, 1 MeV) sufficiently smaller than the actual value, and only the spectrum in the lower energy portion, having small contribution of flux (having small influence from errors in the threshold value $E_{th}$) is used. The SEE cross section calculating section 102 then accepts a spectrum number of the white neutrons with the above features, from a user via the input section 141 and the input unit (S401). For example, the SEE cross section calculating section 102 accepts the spectrum number of (k=N−1) white neutrons. Here, 4 (four) is sufficient in practice as the number N of the spectrum data of the white neutrons to be registered in the spectrum management DB 121. In the example as shown in FIG. 3, it is enough to use the spectra with the shielding member thickness of 4" and 8". Following discussion will be made assuming that k=3.

Next, the SEE cross section calculating section 102 obtains spectrum data as to each k spectrum numbers accepted in S401, from the spectrum management DB 121 (S402). Furthermore, the SEE cross section calculating section 102 obtains from the testing result management DB 123, error counts $N_{err}^{[j]}$ respectively being associated with the spectrum numbers, as to each of the k spectrum numbers accepted in S401 (S403).

Next, the SEE cross section calculating section 102 accepts a threshold value $E_{th}$ from the user via the input section 141 and the input unit (S404). Then, by use of this threshold value $E_{th}$, each spectrum data, and the error count of each spectrum data, being obtained in S402 and S403, the integral equation as shown in the above EQUATION 9 is directly executed to obtain $c_{ij}$, and then the simultaneously equation to obtain coefficients $a_1, a_2 \ldots$ as shown in EQUATION 14 is established (S405).

$$\begin{pmatrix} c_{11} & c_{12} & c_{13} \\ c_{21} & c_{22} & c_{23} \\ c_{31} & c_{32} & c_{33} \end{pmatrix} \begin{pmatrix} a_1 \\ a_2 \\ a_3 \end{pmatrix} T_{irr} = \begin{pmatrix} N_{err}^{[1]} \\ N_{err}^{[2]} \\ N_{err}^{[3]} \end{pmatrix}$$ [EQUATION 14]

$$c_{ji} = \int_{E_{th}}^{\infty} \left( \frac{\partial \Phi^{[j]}}{\partial E} \right) (\log(E - E_{th}))^{\frac{1}{i+1}} dE$$

Here, j takes a value of 1 to k (=N−1).

Next, the SEE cross section calculating section 102 carries out the calculation of EQUATION 14, and obtains coefficients a1, a2, ... (S406). Subsequently, the SEE cross section calculating section 102 obtains from the spectrum management DB 121, spectrum data having a large flux contribution in the lower energy portion (largely influenced by errors in the threshold value $E_{th}$), that is, the spectrum data having the spectrum number having not been designated in S401. Simultaneously, the SEE cross section calculating section 102 obtains from the testing result management DB 123, the error count $N_{err}^{[j]}$ (here, assumed to be $N_{err}^{[0]}$), being associated with the above spectrum number (S407). Then, by use of the threshold value $E_{th}$, the spectrum data and the error count of the spectrum data as obtained in S407, the integral equation as shown in the above EQUATION 9 is directly executed to obtain $c_{0j}$, and F as shown in EQUATION 15 is calculated (S408).

$$F = \begin{pmatrix} c_{01} & c_{02} & c_{03} \end{pmatrix} \begin{pmatrix} a_1 \\ a_2 \\ a_3 \end{pmatrix} - N_{err}^{[0]}$$ [EQUATION 15]

Here, since the threshold Eth is assumed to be a sufficiently small value, a result obtained by directly executing the integral equation as shown in EQUATION 9 should be larger than the error count $N_{err}^{[0]}$, which actually occurred. Therefore, F shown above becomes a positive value. If the absolute value of F is small enough, the coefficients a1, a2, ... become well approximate to one another. Then, the value of F is outputted to the output unit from the output section 142, and the user is inquired whether or not there is any problem in the setting of threshold value $E_{th}$. Subsequently, if a direction to reset the threshold value is accepted from the user via the input section 141 and the input unit, the processing returns to S404. On the other hand, if a direction to calculate the SEE cross section is accepted, the processing goes to S410 (S409).

In the meantime, in S410, the SEE cross section calculating section 102 sets the coefficients a1, a2, ... into EQUATION 13, and stores the result as the SEE cross section in the SEE cross section storage 124.

By the way, the SEE occurrence count calculating section 103 according to the present embodiment reads out the SEE cross section calculated as described above from the SEE cross section storage 124, calculates an SEE occurrence count by the above EQUATION 11, and stores the SEE occurrence count thus obtained in the SEE occurrence count storage 125.

The second embodiment of the present invention has been explained in the description above. It is to be noted that in the present embodiment, a user carries out setting of the threshold value $E_{th}$, but it is also possible to allow the SEE cross section calculating section 102 to execute the setting systematically with a method as the following false position method.

Firstly, $E_{low}$ which is sufficiently smaller than the actual threshold value $E_{th}$ (for example, 1 MeV) is set as the threshold value $E_{th}$, and the operational flow as shown in FIG. 11 is executed. If a value F is obtained (it should be positive) in S408, the processing returns to S404 at S409. Next, $E_{high}$ which is sufficiently larger than the actual threshold value $E_{th}$ (for example, 20 MeV) is set as the threshold value $E_{th}$, and the operational flow is executed. Then, in S408 next, the value F should become negative. Since the value F is a continuous monotonic function of the threshold $E_{th}$, a threshold value $E_{th}$ which gives F=0 should be between $E_{low}$ and $E_{high}$. In view of this, the processing returns to S404 at S409 and a new threshold value $E_{th}$ is determined by EQUATION 16, being calculated in the SEE cross section calculating section 102.

$$E_{th}^* = \frac{E_{low} + E_{high}}{2} \quad \text{[EQUATION 16]}$$

If, in the next S408, the value F is positive, the threshold value $E_{th}$ giving F=0 exists between the $E_{low}$ and the current set value $E_{th}$. Then, the processing returns to S404 and EQUATION 16 is executed by replacing $E_{high}$ with the current set value $E_{th}$, and accordingly, a new threshold value $E_{th}$ is set. On the other hand, if the value F is negative, the threshold value $E_{th}$ giving F=0 exists between the current set value $E_{th}$ and $E_{high}$. Therefore the processing returns to S404 and EQUATION 16 is executed by replacing $E_{low}$ with the current set value $E_{th}$, and accordingly, a new threshold value $E_{th}$ is set. With the setting above, the operational flow is executed. The process as described above is repeated, and a threshold value $E_{th}$ with the value F (>0) being the closest to zero is detected, and then the processing proceeds to S410.

Third Embodiment

In order to handle the experimental data coherently, it is desirable that a functional formula used for notation of data in the (quasi-) mono-energy neutron method can be derived also in the white neutron method. Generally, such a function satisfying the above requirement is nonlinear function as shown in EQUATION 17.

$$\sigma(E) = f(a_1, a_2, a_3, \ldots) \quad \text{[EQUATION 17]}$$

Therefore, parameters a1, a2, . . . may be calculated by means of a technique of various kinds of nonlinear optimization. The most desirable technique depends upon the functional formula, but here, a method to obtain a parameter of the Weibull Fit function as shown in EQUATION 5 will be explained as the following. The semiconductor device evaluation support apparatus according to the present embodiment obtains a parameter of the Weibull Fit function, and the SEE cross section is calculated. It is to be noted that the total flux calculating section 101 and the total flux management DB 122 are not necessary in the semiconductor device evaluation support apparatus according to the present embodiment. Instead of those elements above, a field for registering a spectrum number of the spectrum data used in RUN is added to the entry of the testing result management DB 123. Furthermore, in the present embodiment, processing in the SEE cross section calculating section 102 and that of the SEE occurrence count calculating section 103 are different from those in the first embodiment. Except the above points, the present embodiment is identical to the first embodiment.

Figure 12:
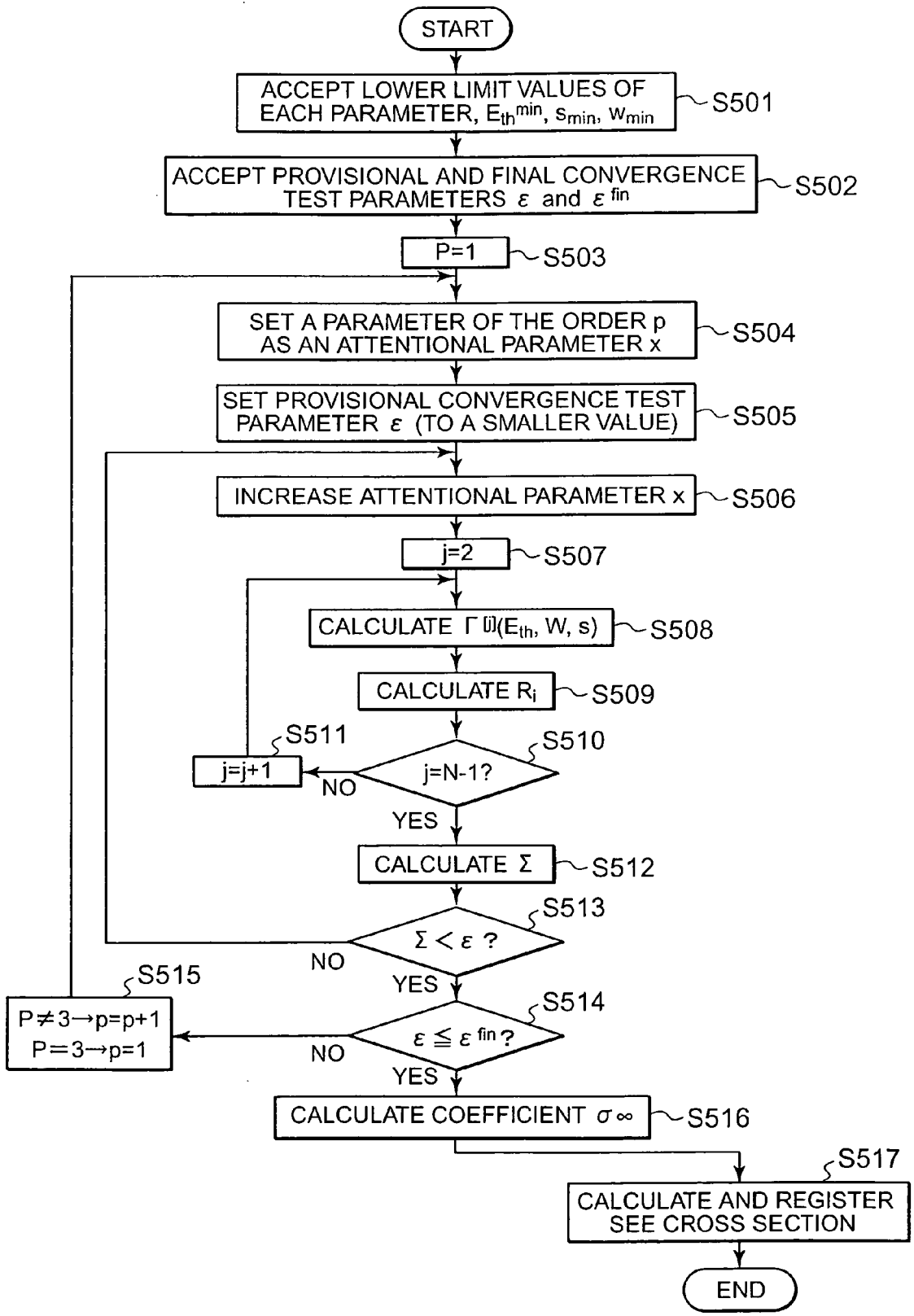
FIG. 12 is a flowchart to explain an operational flow of SEE cross section calculating section 102 according to the third embodiment of the present invention.

FIG. 12 is a flowchart to explain an operational flow of the SEE cross section calculating section 102 according to the third embodiment of the present invention.

Firstly, the SEE cross section calculating section 102 accepts from a user via the input section 141 and the input unit, $E_{th}^{min}$, $s_{min}$, $W_{min}$, respectively, being the lower limit values of $E_{th}$, s, W, and allows the memory and the like to hold those parameters with a given order (S501). Similarly, the SEE cross section calculating section 102 accepts a provisional convergence test parameter $\epsilon$ and a final convergence test parameter $\epsilon^{fin}$ from the user, and allows the memory and the like to hold those parameters (S502).

Next, the SEE cross section calculating section 102 sets a count value p to 1 (S503). Then, a parameter of the order p is set as an attentional parameter x*, and remaining parameters are assumed as fixed values (S504). In addition, the provisional convergence test parameter $\epsilon$ is set (S505). On the first time, a value of the provisional convergence test parameter $\epsilon$ which has been accepted in S502 is assumed to be the provisional convergence test parameter $\epsilon$, and on or after the second time, the provisional convergence test parameter $\epsilon$ is assumed to be a value obtained by subtracting a predetermined value $\Delta\epsilon$ from the previously set provisional convergence test parameter $\epsilon$.

Next, the SEE cross section calculating section 102 increases the value of attentional parameter x*, as shown by EQUATION 18, only by a predetermined value $\Delta x$ being sufficiently small, from the current value (on the first time, it is the lower limit value set in S501) (S506). This predetermined value $\Delta x$ is set in advance with respect to each parameter.

$$x^* = x^* + \Delta x \quad \text{[EQUATION 18]}$$

Then, the SEE cross section calculating section 102 sets the count value j to 2 (S507). In the present embodiment, it is assumed that the spectrum number j of the spectrum data having a high flux rate on the lowest energy side is set in advance to have a value of 1.

Next, the SEE cross section calculating section 102 reads out from the spectrum management DB 121, the spectrum data having the spectrum number 1 and the spectrum data having the spectrum number j, and calculates $\Gamma^{[j]}(E_{th}, W, s)$ as shown in EQUATION 19 by use of the above spectrum data items and three parameters $E_{th}$, W, s, and stores the result in the memory and the like (S508).

$$\Gamma^{[j]}(E_{th}, W, s) = \frac{\int_{E_{th}}^{\infty} \left(\frac{\partial \Psi^{[j]}}{\partial E}\right)\left[1 - \exp\left\{-\left(\frac{E - E_{th}}{W}\right)^s\right\}\right] dE}{\int_{E_{th}}^{\infty} \left(\frac{\partial \Psi^{[1]}}{\partial E}\right)\left[1 - \exp\left\{-\left(\frac{E - E_{th}}{W}\right)^s\right\}\right] dE} \quad \text{[EQUATION 19]}$$

In addition, the SEE cross section calculating section 102 reads out from the testing result management DB 123, the error count $N_{err}^{[1]}$ as to the spectrum number 1 and error count $N_{err}^{[j]}$ as to the spectrum number j, uses those error counts to calculate by EQUATION 20 an actual measured value $R_i$ of $\Gamma^{[j]}(E_{th}, W, s)$, and stores the result in the memory and the like (S509).

$$R_i = \frac{N_{err}^{[i]}}{N_{err}^{[1]}} \quad \text{[EQUATION 20]}$$

Next, the SEE cross section calculating section 102 checks whether or not the count value j reaches the number of registrations (N−1) of the spectrum data in the spectrum DB 121 (S510), and if it does not reach the number, the count value is incremented by one (S511) and the processing returns to S508. On the other hand, if the count value reaches the number of registrations, the processing proceeds to S512.

In the meantime, there is established a relational equation as shown in EQUATION 21 among three parameters $E_{th}$, W, s of the Weibull Fit function, the total fluence $\Psi^{[i]}$ of the spectrum data of the white neutrons having the spectrum number j, and the error count $N_{err}^{[j]}$ (ideal value) in the white neutrons having the spectrum number j.

$$\int_{E_{th}}^{\infty} \left(\frac{\partial \Psi^{[i]}}{\partial E}\right) \sigma(E) dE = \quad \text{[EQUATION 21]}$$
$$\sigma_\infty \int_{E_{th}}^{\infty} \left(\frac{\partial \Psi^{[i]}}{\partial E}\right) \left[1 - \exp\left\{-\left(\frac{E-E_{th}}{W}\right)^s\right\}\right] dE = N_{err}^{[i]}$$

It is to be noted here that the coefficient $\sigma\infty$ is common to all the data. In view of this, the relational expression as shown in EQUATION 22 can be established, when the error count $N_{err}^{[2]}$ and the subsequent counts are divided by the error count $N_{err}^{[1]}$ which is the error count in the spectrum data having a high flux rate in the lowest energy side. Here, the $N_{err}^{[2]}$ and the subsequent counts are obtained from the spectrum data other than the above spectrum data having a high flux rate in the lowest energy side.

$$\Gamma^{[i]}(E_{th}, W, s) = \quad \text{[EQUATION 22]}$$
$$\frac{\int_{E_{th}}^{\infty} \left(\frac{\partial \Psi^{[i]}}{\partial E}\right)\left[1 - \exp\left\{-\left(\frac{E-E_{th}}{W}\right)^s\right\}\right] dE}{\int_{E_{th}}^{\infty} \left(\frac{\partial \Psi^{[1]}}{\partial E}\right)\left[1 - \exp\left\{-\left(\frac{E-E_{th}}{W}\right)^s\right\}\right] dE} = \frac{N_{err}^{[i]}}{N_{err}^{[1]}} = R_i$$

Therefore, it is desired that the parameters $E_{th}$, W, s are set so that $\Gamma^{[j]}(E_{th}, W, s)$ obtained from the spectrum data in EQUATION 19 becomes closer to $R_i$ which is obtained from the actual measured value in EQUATION 20. In view of this, the SEE cross section calculating section 102 calculates by EQUATION 23, a difference $\Sigma$ between each of (N−1) number of $\Gamma^{[j]}(E_{th}, W, s)$ and $R_i$ (S512).

$$\Sigma = \sum_{i=2}^{M} (\Gamma^{[i]}(E_{th}, W, s) - R_i)^2 \quad \text{[EQUATION 23]}$$

Then, the SEE cross section calculating section 102 determines whether this difference $\Sigma$ is less than the provisional convergence test parameter $\epsilon$ (S513). If the difference $\Sigma$ is equal to or more than the provisional convergence test parameter $\epsilon$, the processing returns to S506, and the above processing is repeated until an optimum value of the attentional parameter x* which makes the difference $\Sigma$ be less than the provisional convergence test parameter $\epsilon$ is detected.

On the other hand, if the difference $\Sigma$ is less than provisional convergence test parameter $\epsilon$, it is further checked whether or not this provisional convergence test parameter $\epsilon$ is equal to or less than $\epsilon^{fin}$ which is accepted in S502 (S514). Then, if the provisional convergence test parameter $\epsilon$ is equal to or less than the final convergence test parameter $\epsilon^{fin}$, the processing proceeds to S516. If it is not, the count value p is incremented by one (if p=3, P is reset to 1) (S515), and the processing returns to S504.

In S516, the SEE cross section calculating section 102 substitutes into EQUATION 21, optimum values of parameters $E_{th}$, W, s obtained as described above, the spectrum data having an arbitrary spectrum number j, and the error count $N_{err}^{[j]}$ in the white neutrons having the spectrum number j, so as to obtain the coefficient $\sigma\infty$. Accordingly, all the parameters as shown in EQUATION 5 are determined. Then, the coefficient $\sigma\infty$ and the parameters $E_{th}$, W, s are substituted into EQUATION 5, and the SEE cross section is calculated. Then, the SEE cross section storage 124 stores thus obtained SEE cross section. (SS17).

In the meantime, the SEE occurrence count calculating section 103 reads out the SEE cross section thus calculated from the SEE cross section storage unit 124, calculates the SEE occurrence count by the above EQUATION 11, and stores the SEE occurrence count in the SEE occurrence count storage 125.

The third embodiment of the present invention has been explained in the description above. It is to be noted that in the present embodiment, a convergence is not guaranteed with respect to the provisional convergence test parameter $\epsilon$. In view of this point, it may be possible to limit the number of repeated calculations, and if it goes over the limited number, the processing proceeds from S513 to S515, and the processing shifts to the repeated calculation for the next parameter. Alternatively, it may also be possible to stop calculation by going from S514 to S516, even before the value becomes less than the final convergence test parameter $\epsilon^{fin}$. With those settings above, it is possible to obtain a solution under the condition that an average error ($\Sigma/M$) is ½, for example, and it is equivalent to the case that the convergence condition of $\Sigma < \epsilon^{fin}$ has been satisfied.

Figure 13:
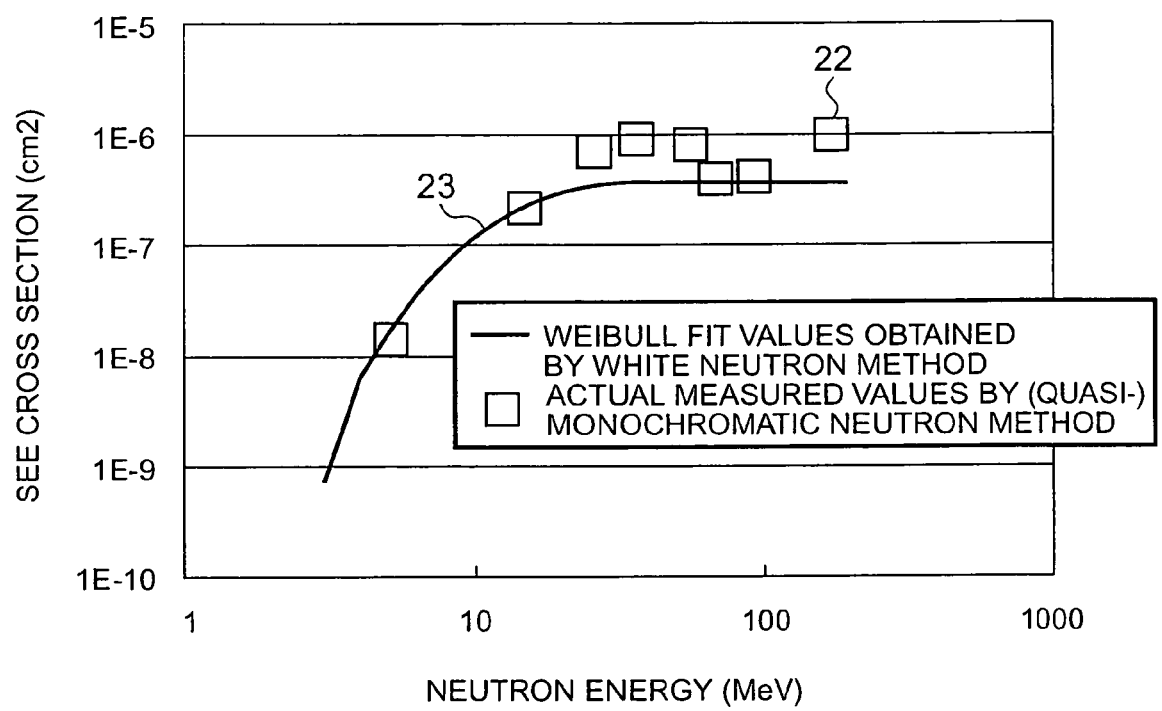
FIG. 13 is a chart showing an example of computed value of the SEE cross section, represented by Weibull Fit function obtained by the third embodiment of the present invention, and actual measured values of SEE cross section obtained by the (quasi-) mono-energy neutron method.
Figure 14:
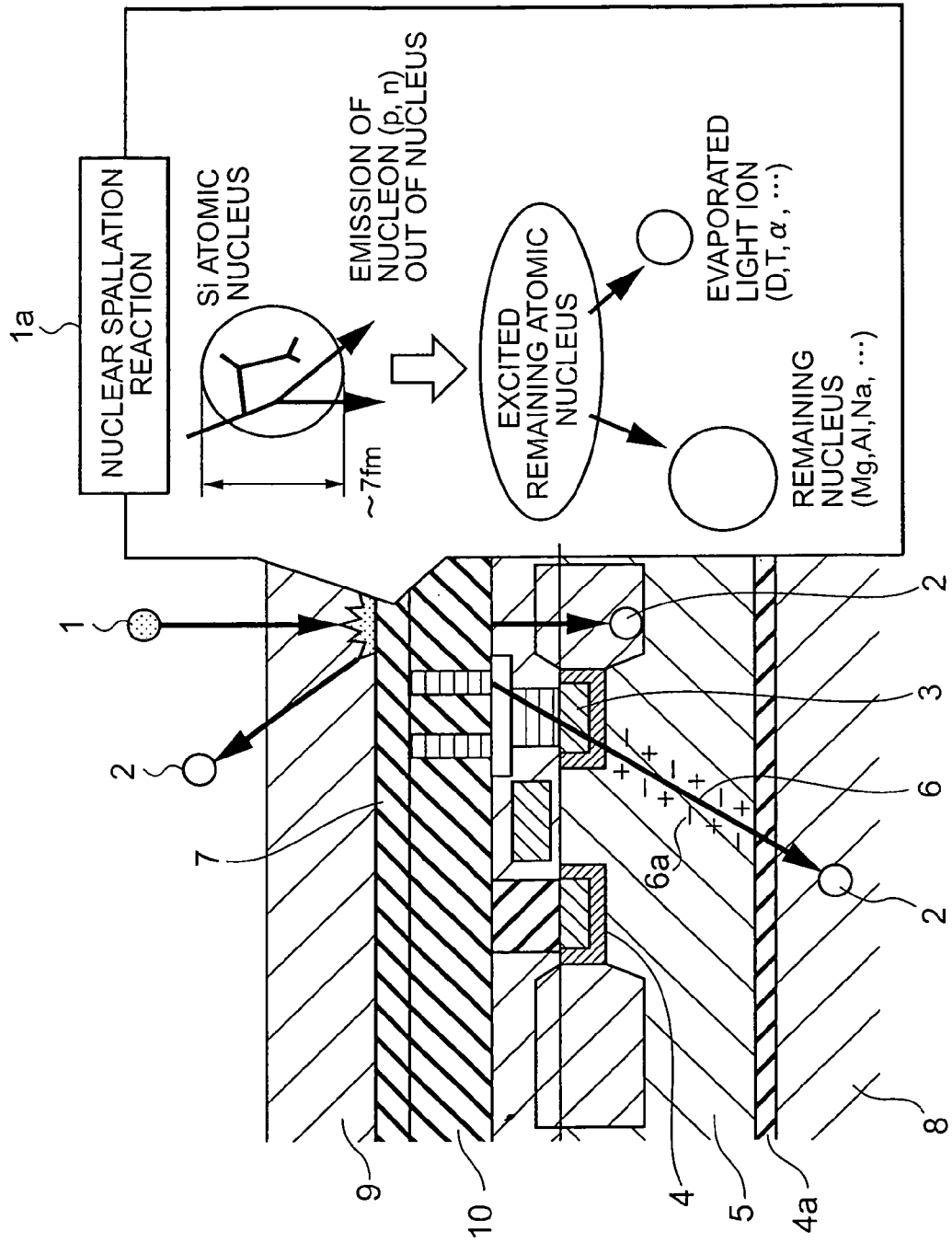
FIG. 14 is an illustration to conceptually explain a principle of soft errors caused by cosmic ray neutrons.
Figure 15:
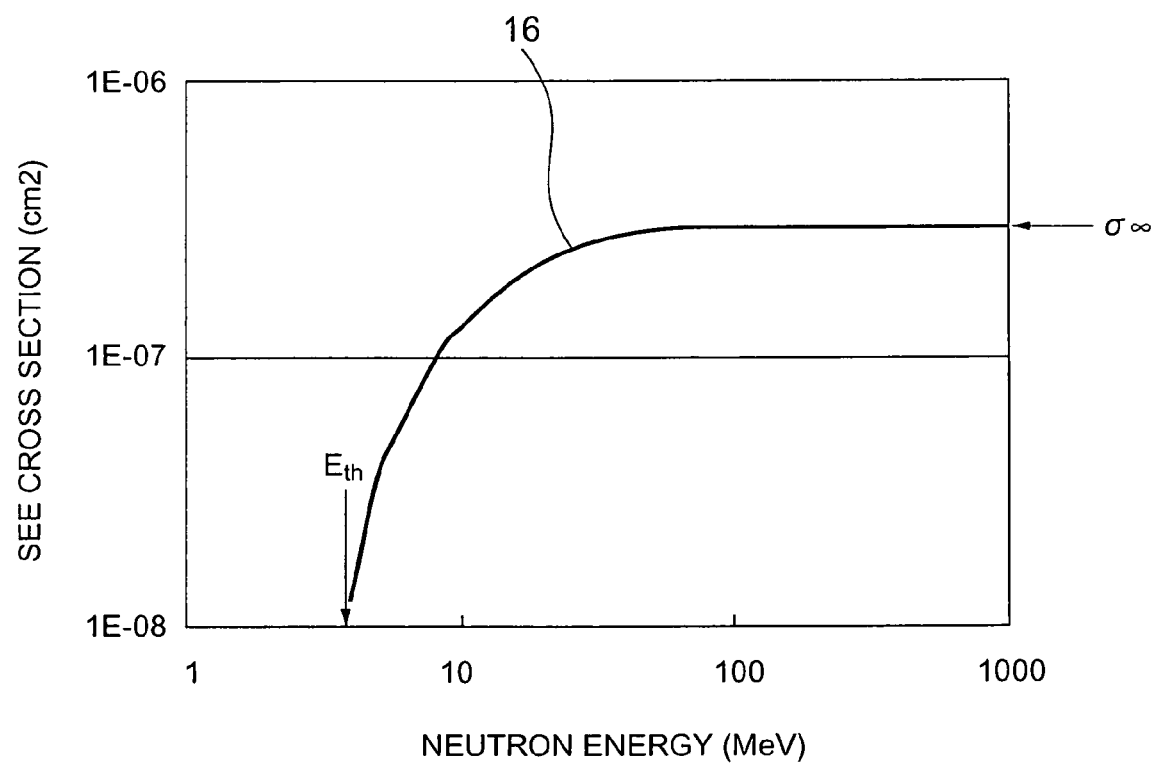
FIG. 15 is a chart showing a relationship between neutron energy (MeV) and SEE cross section ($cm^2$) in a semiconductor device (SRAM).

In FIG. 13, an example of the computed values 23 of SEE cross sections is shown in the Weibull Fit function as obtained by the present embodiment, and actual measured values 22 of the SEE cross sections obtained by (quasi-) mono-energy neutron method. As is apparent from this chart, both values show extremely favorable matching.

Based on the SEE resistivity evaluation testing result according to the white neutron method in each of the embodiments of the present invention, as described above, an SEE cross section can be obtained as a common physical quantity, which does not depend upon individual facilities and a shape of spectrum. Therefore, it is possible to expect a remarkable enhancement in reliability and efficiency for the SEE resistivity evaluation of semiconductor device relating to neutron irradiation. While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

What is claimed is:

1. A semiconductor device evaluation support apparatus, comprising, a spectrum storing means which stores multiple spectrum data of white neutrons having spectrum shapes different from one another, a testing result storing means which stores multiple SEE (Single Event Effect) counts obtained by a white neutron method conducted utilizing each of said multiple spectrum data, and an SEE cross section calculating means which calculates SEE cross section, wherein, said SEE cross section calculating means carries out, a first processing including, a processing for reading out from said spectrum storing means, predetermined spectrum data having a large flux contribution in a lower energy portion, inputting the predetermined spectrum data into the Weibull Fit function representing SEE cross section, thereby calculating a first relating value of the SEE counts, and simultaneously reading out from said spectrum storing means arbitrary spectrum data other than said predetermined spectrum data, inputting said arbitrary spectrum data into said Weibull Fit function, thereby calculating a second relating value of the SEE counts, and calculating a computed ratio as a ratio between the first and the second relating values, a processing for reading out from said testing result storing means the SEE counts as to said predetermined spectrum data and the SEE counts as to said arbitrary spectrum data, and calculates an actually measured ratio, as a ratio therebetween, and a processing for calculating a difference between said computed ratio and said actually measured ratio, and the first processing then repeating the above processing multiple number of times to obtain a sum of said differences, a second processing for changing a parameter value of said Weibull Fit function and executing said first processing repeatedly, so as to detect a parameter value to make said sum of said differences equal to or less than a predetermined value, and a third step for generating the SEE cross section represented by the Weibull Fit function by use of said parameter value thus detected.

2. A computer readable program to evaluate resistivity against an error in the semiconductor device caused by cosmic ray neutrons, wherein, said computer includes a storage unit which stores multiple spectrum data of white neutrons with spectrum shapes different from one another, and multiple SEE (Single Event Effect) counts obtained by a white neutron method conducted by use of each of said multiple spectrum data, and said program allows said computer to execute, a first step including, a step for reading out from said storage unit, predetermined spectrum data having a large flux contribution in a lower energy portion, inputting the predetermined spectrum data into the Weibull Fit function representing SEE cross section, thereby calculating a first relating value of the SEE counts, and simultaneously reading out from said storage unit arbitrary spectrum data other than said predetermined spectrum data, inputting said arbitrary spectrum data into said Weibull Fit function, thereby calculating a second relating value of the SEE counts, and calculating a computed ratio as a ratio between the first and the second relating values, a step for reading out from said storage unit the SEE counts as to said predetermined spectrum data and the SEE counts as to said arbitrary spectrum data, and calculating an actually measured ratio, as a ratio therebetween, and a step for calculating a difference between said computed ratio and said actually measured ratio, and the first step then repeating the above steps multiple number of times to obtain a sum of said differences, a second step for changing a parameter value of said Weibull Fit function and executing said first step repeatedly, so as to detect a parameter value to make said sum of said differences equal to or less than a predetermined value, and a third step for storing in said storage unit, the SEE cross section represented by the Weibull Fit function by use of said parameter value thus detected.

* * * * *